US012811394B2

(12) United States Patent
Do et al.

(10) Patent No.: US 12,811,394 B2
(45) Date of Patent: Nov. 24, 2026

(54) DEVICE FOR ELECTROSTATIC DISCHARGE PROTECTION USING SILICON-CONTROLLED RECTIFIER

(71) Applicant: SAMSUNG ELECTRONICS CO., LTD., Suwon-si (KR)

(72) Inventors: Kyoungil Do, Suwon-si (KR); Chanhee Jeon, Suwon-si (KR); Jooyoung Song, Suwon-si (KR); Jinwoo Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 135 days.

(21) Appl. No.: 18/733,208

(22) Filed: Jun. 4, 2024

(65) Prior Publication Data

US 2024/0413631 A1 Dec. 12, 2024

(30) Foreign Application Priority Data

Jun. 9, 2023 (KR) ........................ 10-2023-0074383

(51) Int. Cl.

| | |
|---|---|
| ***H02H 9/04*** | (2006.01) |
| ***H03K 17/60*** | (2006.01) |
| ***H03K 17/687*** | (2006.01) |
| ***H10D 89/60*** | (2025.01) |

(52) U.S. Cl.

CPC ............. *H02H 9/046* (2013.01); *H03K 17/60* (2013.01); *H03K 17/687* (2013.01); *H10D 89/713* (2025.01)

(58) Field of Classification Search

CPC ...... H02H 9/046; H03K 17/60; H03K 17/687; H10D 89/713; H10D 8/80; H10D 18/251; H10D 62/126; H10D 89/811; H10D 89/921; H10D 89/931

See application file for complete search history.

(56) References Cited

U.S. PATENT DOCUMENTS

| | | | | |
|---|---|---|---|---|
| 5,452,171 | A * | 9/1995 | Metz ...................... | H02H 9/046 361/118 |
| 7,106,562 | B2 | 9/2006 | Kitagawa | |
| 7,842,971 | B2 | 11/2010 | Liu et al. | |

(Continued)

FOREIGN PATENT DOCUMENTS

| | | |
|---|---|---|
| KR | 10-2441903 B1 | 9/2022 |

OTHER PUBLICATIONS

Communication dated Oct. 22, 2024, issued by European Patent Office in European Patent Application No. 24180377.4.

*Primary Examiner* — Thienvu V Tran
*Assistant Examiner* — Muaamar Qahtan Al-Taweel
(74) *Attorney, Agent, or Firm* — Sughrue Mion, PLLC

(57) ABSTRACT

A device includes: a first silicon-controlled rectifier comprising a first PNP bipolar junction transistor (BJT) and a first NPN BJT in which bases and collectors are cross-coupled; and a field effect transistor (FET) configured to, based on an electrostatic discharge occurring between an anode of the first silicon-controlled rectifier and a cathode of the first silicon-controlled rectifier, trigger the first silicon-controlled rectifier. An emitter of the first PNP BJT corresponds to a plurality of first p+ regions being spaced apart from each other in a first direction. The FET is connected to the first silicon-controlled rectifier through at least one first n+ region disposed between the plurality of first p+ regions.

18 Claims, 29 Drawing Sheets

(56) References Cited

U.S. PATENT DOCUMENTS

| | | | | |
|---|---|---|---|---|
| 8,247,839 | B2 | 8/2012 | Van Wijmeersch | |
| 8,842,400 | B2 | 9/2014 | Ker et al. | |
| 9,041,054 | B2 | 5/2015 | Van Wijmeersch et al. | |
| 10,134,724 | B2 | 11/2018 | Lee | |
| 2003/0234405 | A1* | 12/2003 | Lai | H10D 18/251 257/107 |
| 2004/0016970 | A1* | 1/2004 | Chen | H10D 89/601 257/355 |
| 2004/0021998 | A1 | 2/2004 | Salome et al. | |
| 2005/0275029 | A1 | 12/2005 | Watt | |
| 2008/0088994 | A1* | 4/2008 | Lai | H10D 89/713 361/56 |
| 2008/0180869 | A1* | 7/2008 | Sugahara | H03K 17/725 361/91.5 |
| 2009/0026493 | A1* | 1/2009 | Hiraoka | H10D 89/713 257/173 |
| 2012/0099229 | A1 | 4/2012 | Domanski et al. | |
| 2013/0009204 | A1* | 1/2013 | Song | H10D 89/713 257/119 |
| 2015/0236500 | A1* | 8/2015 | Wang | H02H 9/04 361/18 |

* cited by examiner

DEVICE FOR ELECTROSTATIC DISCHARGE PROTECTION USING SILICON-CONTROLLED RECTIFIER

CROSS-REFERENCE TO RELATED APPLICATION

This application is based on and claims priority under 35 U.S.C. § 119 to Korean Patent Application No. 10-2023-0074383, filed on Jun. 9, 2023, in the Korean Intellectual Property Office, the disclosure of which is incorporated by reference herein in its entirety.

BACKGROUND

1. Field

The disclosure relates to electrostatic discharge protection, and more particularly, to a device for electrostatic discharge protection using a rectifier (such as a silicon-controlled rectifier).

2. Description of Related Art

Electrostatic discharge (ESD) may cause malfunctions or even damage integrated circuits. Accordingly, an integrated circuit may include an electrostatic discharge protection component, and the electrostatic discharge protection component may protect an internal circuit from an electrostatic discharge generated outside the integrated circuit. Due to the development of semiconductor processes, sizes of elements in integrated circuits may be reduced, an operating voltage of elements in the integrated circuits may be reduced to lower power consumption, and the frequency of signals input and output to the integrated circuits may be increased for higher performance. Accordingly, components for electrostatic discharge protection may be required to meet various requirements.

SUMMARY

Provided is a device for providing electrostatic discharge protection with a low trigger voltage and a low leakage current.

According to an aspect of the disclosure, a device includes: a first silicon-controlled rectifier comprising a first PNP bipolar junction transistor (BJT) and a first NPN BJT in which bases and collectors are cross-coupled; and a field effect transistor (FET) configured to, based on an electrostatic discharge occurring between an anode of the first silicon-controlled rectifier and a cathode of the first silicon-controlled rectifier, trigger the first silicon-controlled rectifier, wherein an emitter of the first PNP BJT corresponds to a plurality of first p+ regions being spaced apart from each other in a first direction, and wherein the FET is connected to the first silicon-controlled rectifier through at least one first n+ region disposed between the plurality of first p+ regions.

According to another aspect of the disclosure, a device includes: a first silicon-controlled rectifier comprising a first PNP bipolar junction transistor (BJT) and a first NPN BJT in which bases and collectors are cross-coupled; and a field effect transistor (FET) configured to, based on an electrostatic discharge occurring between an anode and a cathode of the first silicon-controlled rectifier, trigger the first silicon-controlled rectifier, wherein an emitter of the first NPN BJT corresponds to a plurality of n+ regions spaced apart from each other in a first direction, and wherein the FET is connected to the first silicon-controlled rectifier through at least one p+ region disposed between the plurality of n+ regions.

According to another aspect of the disclosure, a device includes: a p-well extending in a first direction; a first n-well adjacent to the p-well in a second direction crossing the first direction and, the first n-well extending in the first direction; a first n+ region electrically connected to a cathode node and disposed in the p-well; a first p+ region electrically connected to the cathode node and disposed in the p-well; a plurality of second p+ regions electrically connected to an anode node, the plurality of second p+ regions being spaced apart from each other in the first direction in the first n-well; and at least one second n+ region electrically connected to a field effect transistor (FET) that is electrically connected to the cathode node or the anode node, the at least one second n+ region being disposed between the plurality of second p+ regions in the first n-well.

According to another aspect of the disclosure, a device includes: a p-well extending in a first direction; a first n-well adjacent to the p-well in a second direction crossing the first direction, the first n-well extending in the first direction; a first n+ region electrically connected to an anode node, the first n+ region being disposed in the first n-well; a first p+ region electrically connected to the anode node, the first p+ region being disposed in the first n-well; a plurality of second n+ regions electrically connected to a cathode node, the plurality of second n+ regions being spaced apart from each other in the first direction in the p-well; and at least one second p+ region electrically connected to a field effect transistor (FET) electrically connected to the cathode node or the anode node, the at least one second p+ region being disposed between the plurality of second n+ regions in the p-well.

BRIEF DESCRIPTION OF DRAWINGS

Embodiments will be more clearly understood from the following detailed description taken in conjunction with the accompanying drawings in which.

DETAILED DESCRIPTION

The description merely illustrates the principles of the disclosure. Those skilled in the art will be able to devise one or more arrangements that, although not explicitly described herein, embody the principles of the disclosure. Furthermore, all examples recited herein are principally intended expressly to be only for explanatory purposes to help the reader in understanding the principles of the disclosure and the concepts contributed by the inventor to furthering the art and are to be construed as being without limitation to such specifically recited examples and conditions. Moreover, all statements herein reciting principles, aspects, and embodiments of the disclosure, as well as specific examples thereof, are intended to encompass equivalents thereof.

Terms used in the present disclosure are used only to describe a specific embodiment, and may not be intended to limit the scope of another embodiment. A singular expression may include a plural expression unless it is clearly meant differently in the context. The terms used herein, including a technical or scientific term, may have the same meaning as generally understood by a person having ordinary knowledge in the technical field described in the present disclosure. Terms defined in a general dictionary among the terms used in the present disclosure may be interpreted with the same or similar meaning as a contextual meaning of related technology, and unless clearly defined in the present disclosure, it is not interpreted in an ideal or excessively formal meaning. In some cases, even terms defined in the present disclosure cannot be interpreted to exclude embodiments of the present disclosure.

In one or more embodiments of the disclosure described below, a hardware approach is described as an example. However, since the one or more embodiments of the disclosure include technology that uses both hardware and software, the one or more embodiments of the present disclosure do not exclude a software-based approach.

In addition, in the disclosure, in order to determine whether a specific condition is satisfied or fulfilled, an expression of more than or less than may be used, but this is only a description for expressing an example, and does not exclude description of more than or equal to or less than or equal to. A condition described as 'more than or equal to' may be replaced with 'more than', a condition described as 'less than or equal to' may be replaced with 'less than', and a condition described as 'more than or equal to and less than' may be replaced with 'more than and less than or equal to'. In addition, hereinafter, 'A' to 'B' means at least one of elements from A (including A) and to B (including B).

Figure 1:
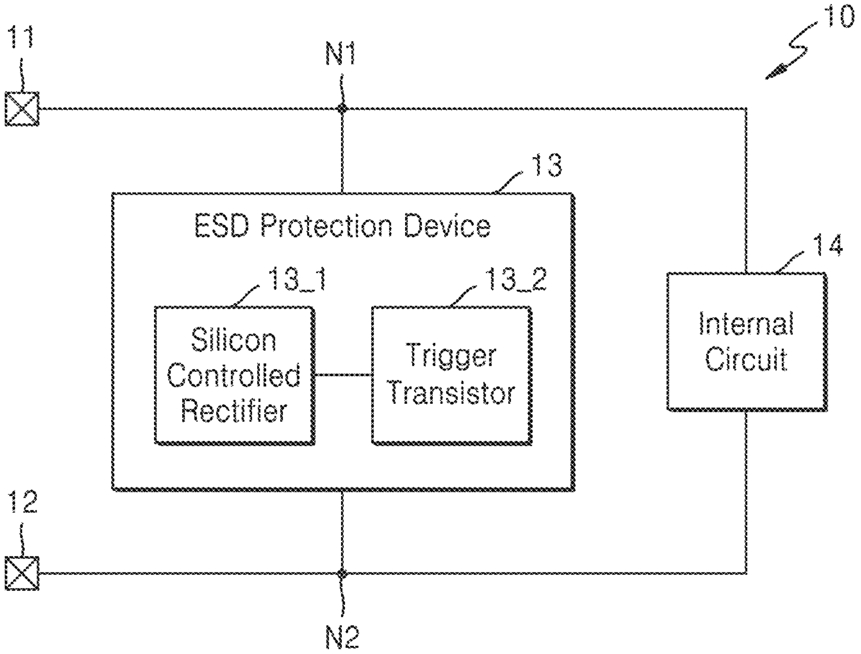
FIG. 1 is a block diagram illustrating a device according to an embodiment.

FIG. 1 is a block diagram illustrating a device 10 according to an embodiment. In some embodiments, the device 10 may include an integrated circuit manufactured by a semiconductor process. For example, the device 10 may be a chip or die, or a semiconductor package including at least one chip or die. As shown in FIG. 1, the device 10 may include a first pad 11, a second pad 12, an electrostatic discharge protection device 13, and an internal circuit 14. Herein, the electrostatic discharge protection device 13 or the device 10 including the electrostatic discharge protection device 13 may be referred to as a 'device' for electrostatic discharge protection.

The first pad 11 and the second pad 12 may be exposed to the outside of the device 10, and the first pad 11 and/or the second pad 12 may be used for transmitting signals or power. For example, the first pad 11 may be one of an input pad for receiving a signal from the outside of the device 10, an output pad for outputting a signal generated by the device 10 to the outside, and an input/output pad for receiving or outputting a signal according to a mode. The second pad 12 may also be a power pad that receives a positive supply voltage and/or a negative supply voltage to provide power to device 10. As shown in FIG. 1, the first pad 11 may be connected to a first node N1. The second pad 12 may be connected to a second node N2. Herein, when two or more components are electrically connected, the two or more components may be simply referred to as being connected. For example, when two components are connected through a resistor (e.g., parasitic resistor), the two components may be referred to as being operatively or electrically 'connected.' Also, when two or more components are directly connected, the two or more components may be referred to as 'coupled.'

When an electrostatic discharge occurs between the first pad 11 and the second pad 12, the electrostatic discharge protection device 13 may be a low-impedance discharge path between the first pad 11 and the second pad 12. Accordingly, the internal circuit 14 may be protected from an electrostatic discharge by the electrostatic discharge protection device 13. Hereinafter, a positive electrostatic discharge occurs between the first pad 11 and the second pad 12, that is, between the first node N1 and the second node N2, and accordingly, the electrostatic discharge protection device 13 is a low impedance path through which current flows from the first node N1 to the second node N2, but it is noted that the embodiments are not limited thereto.

Due to the development of semiconductor processes, the size of elements in the internal circuit 14 may decrease, and a junction depth and a thickness of a gate oxide may decrease. In addition, for low power consumption and high operating speed, an operating voltage of the internal circuit 14, that is, the voltage difference between the positive supply voltage and the negative supply voltage may be reduced, and a frequency of a signal input and output through the first pad 11 and/or the second pad 12 may increase. Accordingly, the electrostatic discharge protection device 13 may be required to meet more stringent requirements, such as high current driving capability, low operation starting voltage, low leakage current, low capacitance, and the like.

As shown in FIG. 1, the electrostatic discharge protection device 13 may include a silicon-controlled rectifier (SCR) 13_1 and a trigger transistor 13_2. An anode of the silicon-controlled rectifier 13_1 may be connected to the first node N1, and a cathode of the silicon-controlled rectifier 13_1 may be connected to the second node N2. Herein, the first node N1 may be referred to as an anode or an anode node, and the second node N2 may be referred to as a cathode or a cathode node.

As described below with reference to FIG. 2, the silicon-controlled rectifier 13_1 may have a high current density based on double injection and may provide a high electrostatic discharge performance per unit area, a reduced area, and a reduced capacitance. However, as described below with reference to FIG. 3, a silicon-controlled rectifier (SCR) as a snapback element may have a very high operation starting voltage due to a high breakdown voltage between wells, and accordingly, an internal circuit 14 having a low operating voltage may be damaged by an electrostatic discharge. The trigger transistor 13_2 may generate a trigger current when an electrostatic discharge occurs, and the trigger current may cause the silicon-controlled rectifier 13_1 to early form a low impedance path. Accordingly, elements of the internal circuit 14 having a low operating voltage may be safely protected from the electrostatic discharge, and malfunction of the device 10 may be prevented.

As described below with reference to the drawings, a low trigger voltage is provided by the trigger transistor 13_2. At the same time, a leakage current due to the trigger transistor 13_2 may be reduced or eliminated. Also, a hold voltage may be increased, and accordingly, latch-up of the silicon-controlled rectifier 13_1 may be prevented.

Figure 2:
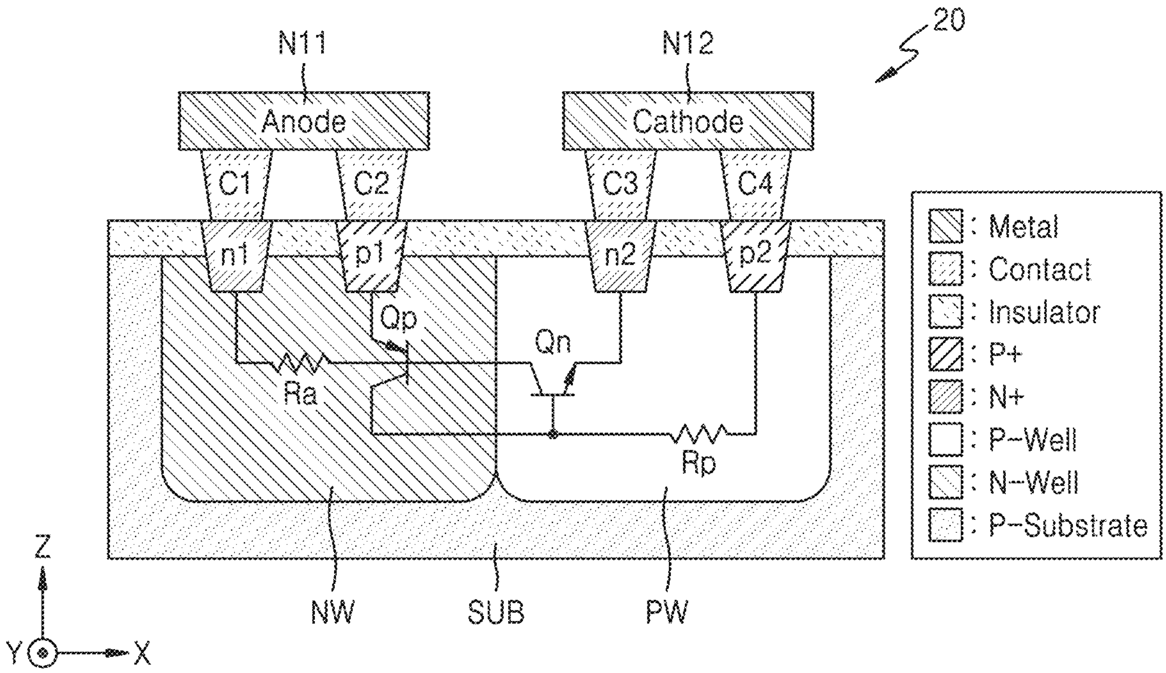
FIG. 2 is a cross-sectional view illustrating a silicon-controlled rectifier according to an embodiment.
Figure 3:
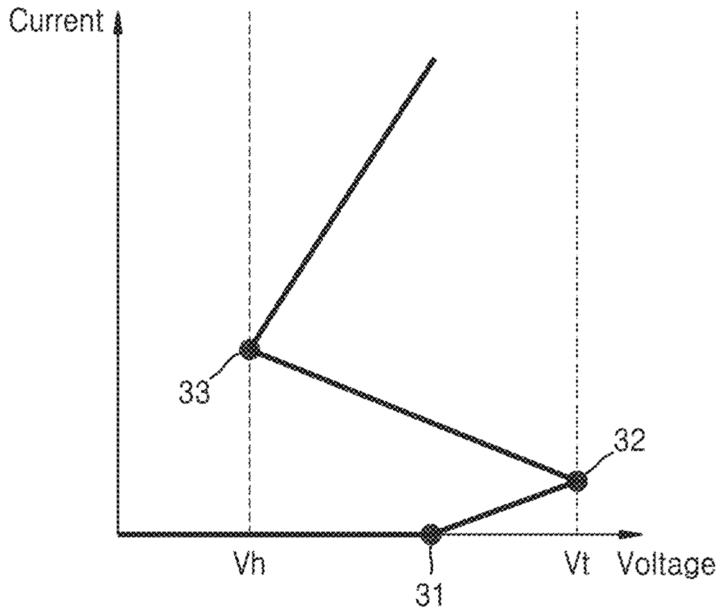
FIG. 3 is a graph showing characteristics of a silicon-controlled rectifier according to an embodiment.

FIG. 2 is a cross-sectional view illustrating a silicon-controlled rectifier 20 according to an embodiment, and FIG. 3 is a graph showing characteristics of the silicon-controlled rectifier 20 according to an embodiment;. For example, the cross-sectional view of FIG. 2 shows a cross-section of the silicon-controlled rectifier 20 along a plane formed by an X-axis and a Z-axis and an equivalent circuit, and the graph of FIG. 3 shows a snapback curve of the silicon-controlled rectifier 20.

Herein, an X-axis direction and a Y-axis direction may be referred to as a first direction and a second direction, respectively, and a Z-axis direction may be referred to as a vertical direction. A plane formed by the X and Y axes may be referred to as a horizontal plane, components disposed in a +Z direction relative to other components may be referred to as being above the other components, and components disposed in a −Z direction relative to other components may be referred to as being below the other components. Also, an 'area' of a component may refer to a size occupied by a component on a plane parallel to a horizontal plane, and a 'width' of a component may refer to a length in a direction orthogonal to a direction in which the component extends. A surface exposed in the +Z direction may be referred to as a 'top surface,' a surface exposed in the −Z direction may be referred to as a 'bottom surface,' and a surface exposed in an ±X direction or ±Y direction may be referred to as a 'side surface.' A pattern including a conductive material may be referred to as a 'conductive pattern' or may simply be referred to as a 'pattern'.

In FIG. 2, the silicon-controlled rectifier 20 may include a PNP bipolar junction transistor (BJT) (Qp) and an NPN BJT (Qn), and bases and collectors of the PNP bipolar transistor and the NPN BJT (Qn) may be cross-coupled. An emitter of the PNP BJT may be referred to as an anode of the silicon-controlled rectifier 20, the collector of an interconnected PNP BJT (Qp) and the base of the NPN BJT (Qn) may be referred to as a gate of the silicon-controlled rectifier 20, and an emitter of the NPN BJT (Qn) may be referred to as a cathode of the silicon-controlled rectifier 20. A resistor Ra connected between the anode and the base of the PNP BJT (Qp) (or the collector of the NPN BJT (Qn)) may include an n-well (NW) resistor. In addition, a resistor Rp connected between the cathode and the base of the NPN BJT (Qn) (or the collector of the PNP BJT (Qp)) may include a p-well (PW) resistor.

As shown in FIG. 2, the silicon-controlled rectifier 20 may be configured by wells and doped regions disposed in the wells, each having its own conductivity type (e.g., p-type or n-type). For example, the n-well NW and the p-well PW may be disposed on a p-type substrate SUB. A first n+ region n1 and a first p+ region p1 may be disposed in the n-well NW, and a second n+ region n2 and a second p+ region p2 may be disposed in the p-well PW. Herein, the n+ region may have a concentration of an n-type dopant higher than that of the n-well NW, and the p+ region may have a concentration of a p-type dopant higher than that of the p-well PW. In some embodiments, the p-well PW may be omitted, and the p-type substrate SUB may function as the p-well PW.

A first contact C1 and a second contact C2 may be disposed on the first n+ region n1 and the first p+ region p1, respectively, and the first contact C1 and the second contact C2 may be interconnected by a first conductive pattern N11. A third contact C3 and a fourth contact C4 may be disposed on the second n+ region n2 and the second p+ region p2, respectively, and the third contact C3 and the fourth contact C4 may be interconnected by the second conductive pattern N12. Accordingly, the PNP BJT (Qp) may be formed by the first p+ region p1 (i.e., emitter), the n-well (NW) (i.e., base), and the p-well PW (i.e. collector), and the NPN BJT (Qn) may be formed by the second n+ region (i.e., emitter), the p-well PW (i.e. base), and the n-well NW (i.e., collector). In some embodiments, the first n+ region n1 and/or the second p+ region p2 may be omitted, and thus the resistor Ra and/or the resistor Rp may be omitted. In some embodiments, a via may be disposed between a contact and a conductive pattern.

In FIG. 3, the silicon-controlled rectifier 20 may have characteristics corresponding to a snapback curve. For example, as the voltage between the anode and the cathode increases, breakdown between the n-well NW and the p-well PW may occur at a first point 31. At a second point 32, the PNP BJT (Qp) and NPN BJT (Qn) may be turned on, respectively, due to a voltage reaching a trigger voltage (Vt), whereby the voltage may decrease, and the current may increase. At a third point 33, the voltage may reach a bipolar hold voltage Vh, and an electrostatic discharge current may flow in a latch mode.

The trigger voltage Vt may reach, for example, 18V to 20V due to the high breakdown voltage (i.e., the voltage at the first point 31) between the n-well NW and the p-well PW, and may not be suitable for protecting elements of an internal circuit having a low operating voltage such as 3V or 1.5V. In addition, the bipolar hold voltage Vh may depend on a forward voltage drop. If the bipolar hold voltage Vh is less than the sum of an operating voltage and a margin of the internal circuit, after an electrostatic discharge has occurred, the PNP BJT (Qp) and NPN BJT (Qn) may not be turned off, and signal distortion, device deterioration and/or damage may occur. As described below with reference to the following figures, a trigger circuit may lower the trigger voltage Vt in the silicon-controlled rectifier 20 while increasing the bipolar hold voltage Vh.

Figure 4:
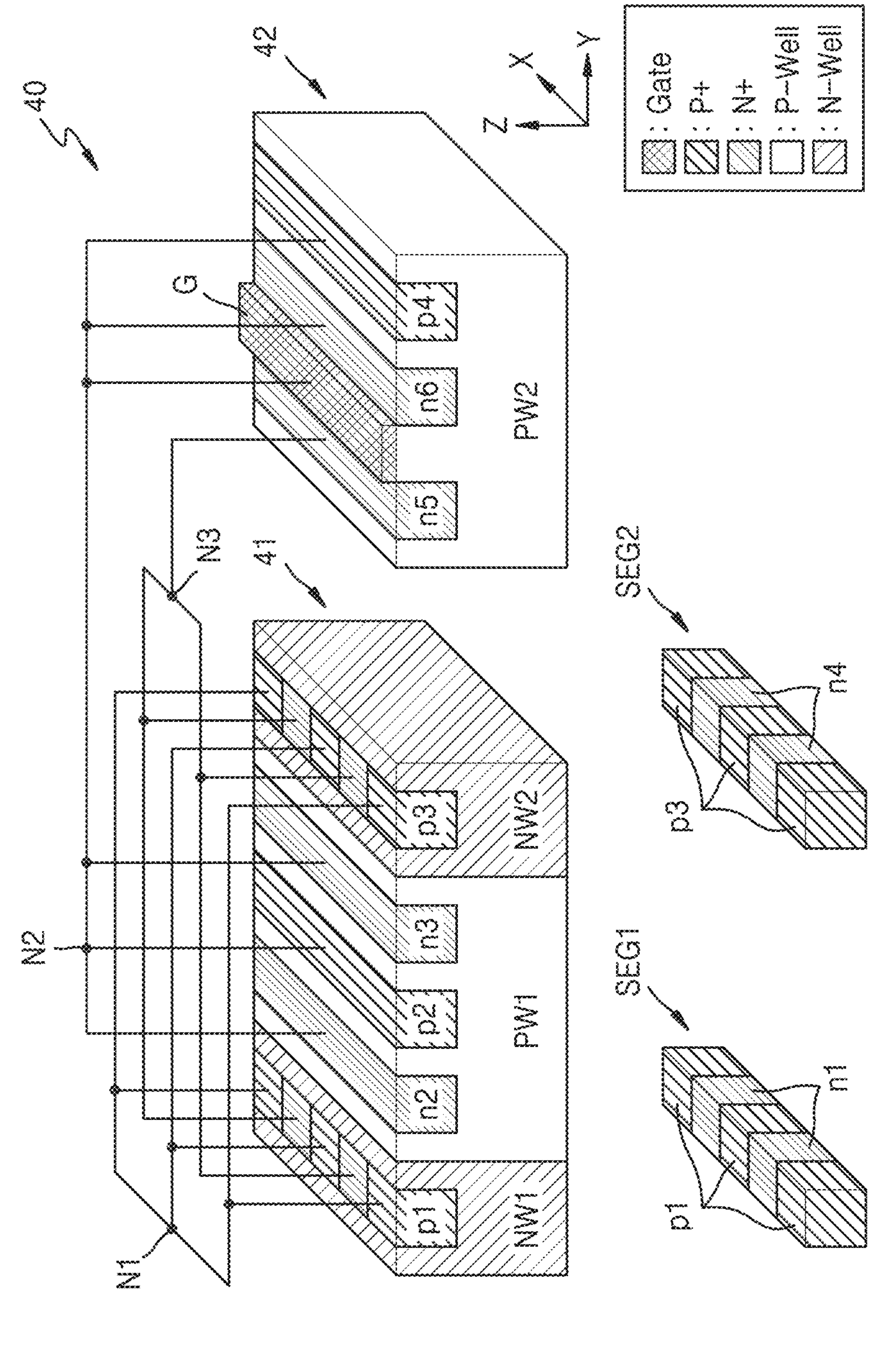
FIG. 4 is a diagram showing a layout of a device according to an embodiment.

FIG. 4 is a diagram illustrating a layout 40 of a device according to an embodiment. For convenience of illustration, contacts and conductive patterns for interconnecting p+ regions, n+ regions, and gates are omitted. In FIG. 4, p+ regions and n+ regions respectively disposed in a first n-well NW1 and a second n-well NW2 are additionally shown at a bottom as a first segment SEG1 and a second segment SEG2. In some embodiments, the structure of FIG. 4 may be formed in a p-type substrate, and the first p-well PW1 and the second p-well PW2 may correspond to the p-type substrate.

In FIG. 4, the layout 40 may include an SCR structure 41 and a FET structure 42. As described below with reference to FIG. 5, the SCR structure 41 may correspond to two silicon-controlled rectifiers, and the FET structure 42 may correspond to a field effect transistor (FET) as a trigger transistor.

The SCR structure 41 may include first and second n-wells NW1 and NW2 and a first p-well PW1. As shown in FIG. 4, the first n-well NW1, the second n-well NW2, and the first p-well PW1 extend in the X-axis direction. As shown in FIG. 4, the first n-well NW1 and the second n-well NW2 may be adjacent to the first p-well PW1 in the Y-axis direction. The first segment SEG1 may be disposed in the first n-well NW1, and the first segment SEG1 may include first p+ regions p1 and first n+ regions n1. As shown in FIG. 4, the first p+ regions p1 may be spaced apart from each other in the X-axis direction, and the first n+ regions n1 may be disposed between the first p+ regions p1. The first p+ regions p1 may be electrically connected to a first node N1, and the first n+ regions n1 may be electrically connected to a third node N3. A second n+ region n2, a second p+ region p2, and a third n+ region n3 may be disposed in the first p-well PW1. The second n+ region n2, the second p+ region p2, and the third n+ region n3 may be electrically connected to a second node N2. A second segment SEG2 may be disposed in the second n-well NW2, and the second segment SEG2 may include third p+ regions p3 and fourth n+ regions n4. As shown in FIG. 4, the third p+ regions p3 may be spaced apart from each other in the X-axis direction, and the fourth n+ regions n4 may be disposed between the third p+ regions p3. The third p+ regions p3 may be electrically connected to the first node N1, and the fourth n+ regions may be electrically connected to the third node N3.

The FET structure 42 may include a second p-well PW2 extending in the X-axis direction. A fifth n+ region n5, a sixth n+ region n6, and a fourth p+ region p4 may be disposed in the second p-well PW2, and a gate electrode G may be disposed on a region between the fifth n+ region n5 and the sixth n+ region n6. The fifth n+ region n5 may be electrically connected to the third node N3, and the sixth n+ region n6, the fourth p+ region p4, and the gate electrode G may be electrically connected to the second node N2. The fifth n+ region n5, the sixth n+ region n6, and the gate electrode G may correspond to an n-channel field effect transistor (NFET), and accordingly, the NFET may be respectively connected to two silicon-controlled rectifiers through the first n+ regions n1 and the fourth n+ regions n4 connected to the third node N3.

Figure 5:
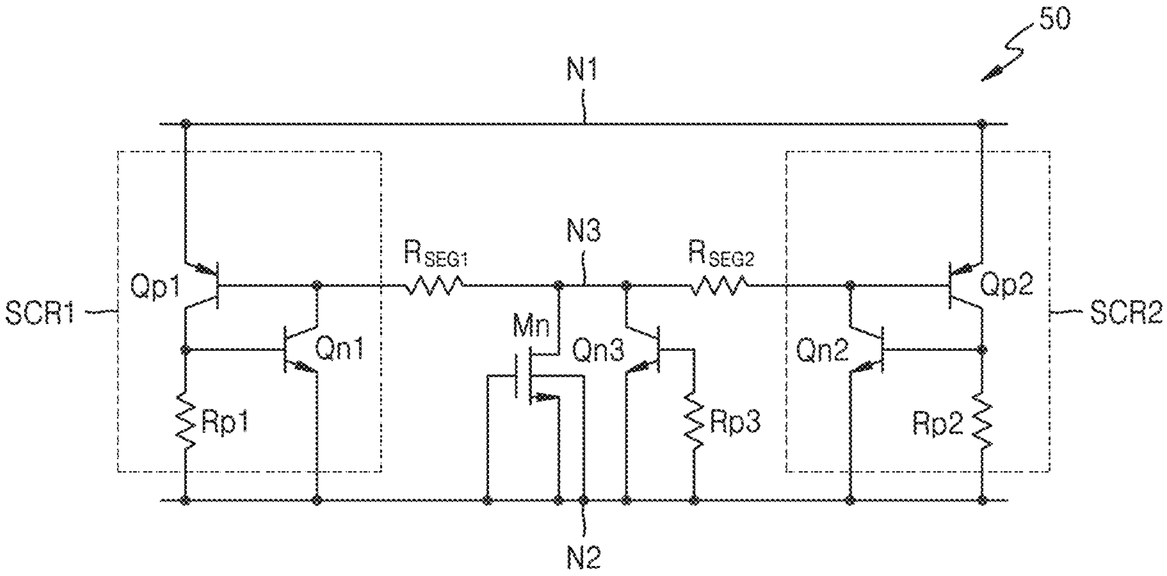
FIG. 5 is a circuit diagram showing an equivalent circuit of a device according to an embodiment.

FIG. 5 is a circuit diagram illustrating an equivalent circuit 50 of a device according to an embodiment. For example, the circuit diagram of FIG. 5 shows the equivalent circuit 50 corresponding to the layout 40 of FIG. 4. Hereinafter, FIG. 5 will be described with reference to FIG. 4.

The equivalent circuit 50 may include a first silicon-controlled rectifier SCR1, a second silicon-controlled rectifier SCR2, an NFET Mn, a third NPN BJT Qn3, a first segment resistor $R_{SEG1}$, a second segment resistor $R_{SEG2}$, and a third p-well resistor Rp3. The first silicon-controlled rectifier SCR1 may include a first PNP BJT Qp1, a first NPN BJT Qn1, and a first p-well resistor Rp1, and the second silicon-controlled rectifier SCR2 may include a second PNP BJT Qp2, a second NPN BJT Qn2, and a second p-well resistor Rp2. In the disclosure, the first silicon-controlled rectifier SCR1 and the second silicon-controlled rectifier SCR2 are examples of various rectifiers that can be used in the embodiments. In the disclosure, the first silicon-controlled rectifier SCR1 may be referred to as a 'first rectifier' and the second silicon-controlled rectifier SCR2 may be referred to as a 'second rectifier'.

The first PNP BJT Qp1 may include an emitter corresponding to the first p+ regions p1, a base corresponding to the first n-well NW1, and a collector corresponding to the first p-well PW1. The first NPN BJT Qn1 may include a collector corresponding to the first n-well NW1, a base corresponding to the first p-well PW1, and an emitter corresponding to the second n+ region n2. The second PNP BJT Qp2 may include an emitter corresponding to the second p+ regions p2, a base corresponding to the second n-well NW2, and a collector corresponding to the first p-well PW1. The second NPN BJT (Qn2) may include a collector corresponding to the second n-well NW2, a base corresponding to the first p-well PW1, and an emitter corresponding to the third n+ region n3. The first segment resistor $R_{SEG1}$ of FIG. 5 may correspond to a resistance between the first n-well NW1 and the first n+ regions n1, and the second segment resistor $R_{SEG2}$ may correspond to a resistor between the second n-well NW2 and the fourth n+ regions n4. Also, the first p-well resistor Rp1 and the second p-well resistor Rp2 of FIG. 5 may respectively correspond to resistors between the first p-well PW1 and the second p+ region p2.

The emitter of the PNP BJT may correspond to p+ regions divided by n+ regions like in the first segment SEG1 and the second segment SEG2 instead of one p+ region integrally formed, and thus, the emitter injection efficiency may be suppressed and base recombination may increase due to the divided p+ regions. Accordingly, a voltage drop between the first node N1 and the second node N2 may be increased and the hold voltage may be increased. Also, in the silicon-controlled rectifier, the well junction path may be opened, and a leakage current of the NFET Mn may be controlled by being designed to pass through the split emitters. Accordingly, a punch-through and reach-through phenomena of the NFET (Mn) may be resolved, and the leakage current may be reduced or eliminated, which is a non-limiting advantage of the disclosure. An internal circuit having a low operating voltage may be safely protected due to the low trigger voltage and at the same time unnecessary power consumption may be eliminated due to the low leakage current.

The NFET Mn may include a drain corresponding to the fifth n+ region n5, a gate corresponding to the gate electrode G, and a source corresponding to the sixth n+ region n6. The third NPN BJT Qn3 may include a collector corresponding to the fifth n+ region n5, a base corresponding to the second p-well PW2, and an emitter corresponding to the sixth n+ region n6. The third p-well resistor Rp3 of FIG. 5 may correspond to a resistor between the second p-well PW2 and the fourth p+ region p4.

Figure 6:
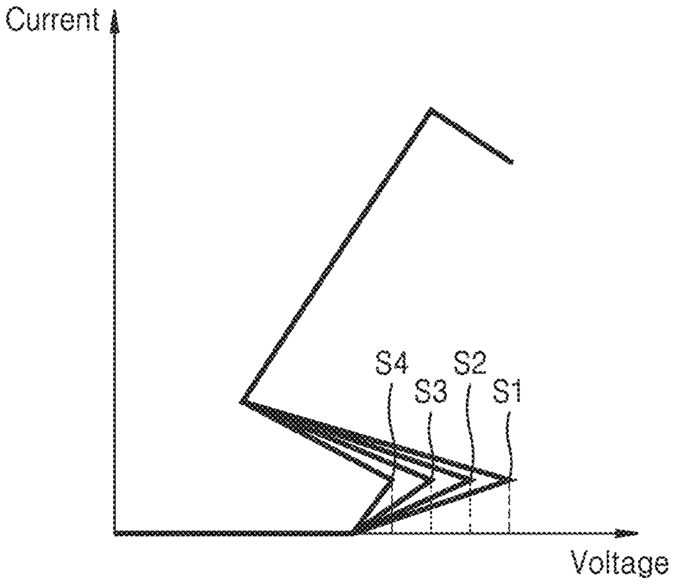
FIG. 6 is a graph showing characteristics of a device according to an embodiment.

FIG. 6 is a graph showing characteristics of a device according to an embodiment. For example, FIG. 6 shows snapback curves S1 to S4 corresponding to the equivalent circuit 50 of FIG. 5. Hereinafter, FIG. 6 is described with reference to FIG. 5.

In some embodiments, a channel width of the NFET Mn of FIG. 5 may be adjusted. For example, when the channel width of the NFET Mn is increased, the current driving capability of the NFET Mn may be improved, and the first and second silicon-controlled rectifiers SCR1 and SCR2 may operate earlier. That is, as the channel width of the NFET Mn increases, the trigger voltage may decrease as shown in the first to fourth snapback curves S1 to S4.

Figure 7A:
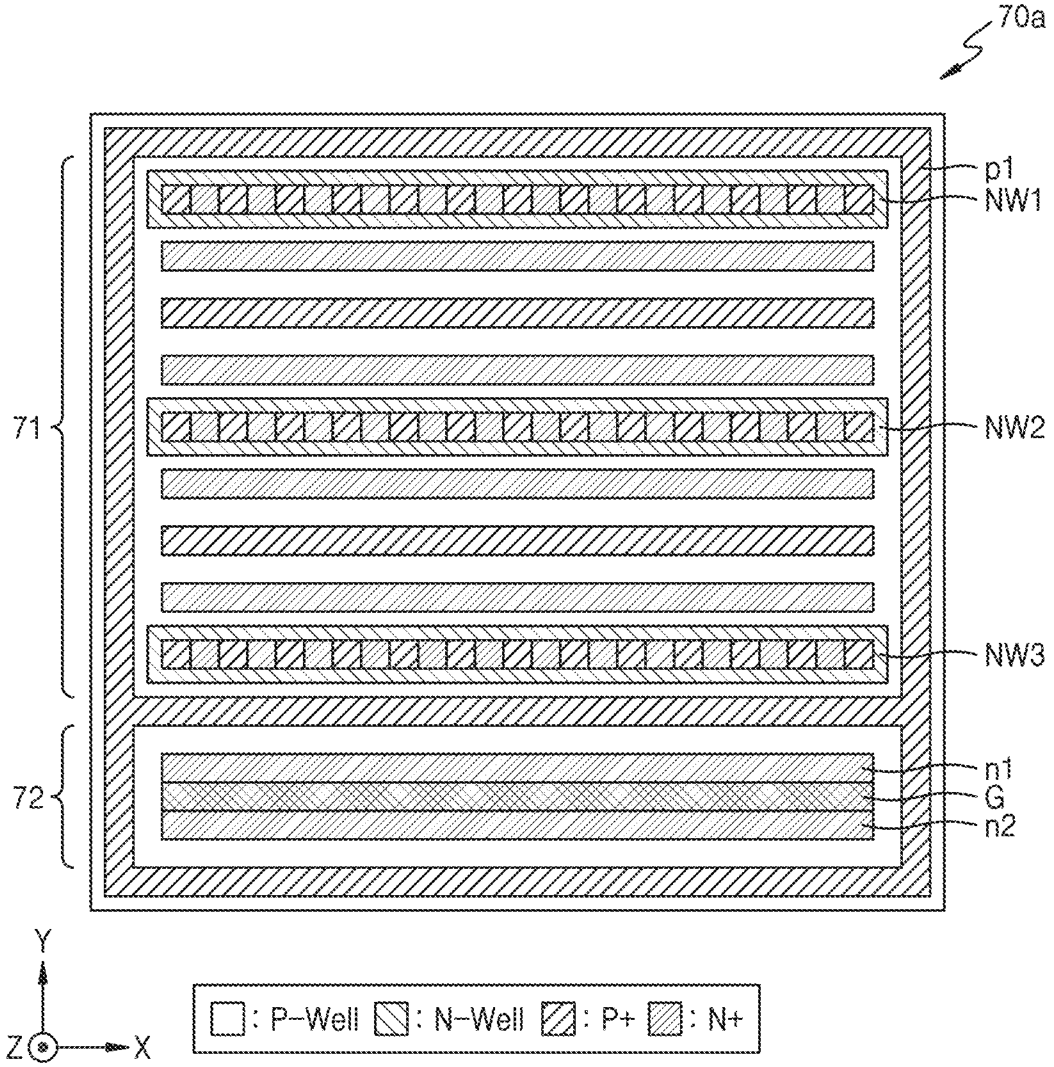
FIGS. 7A and 7B are diagrams illustrating examples of a layout of a device according to an embodiment.
Figure 7B:
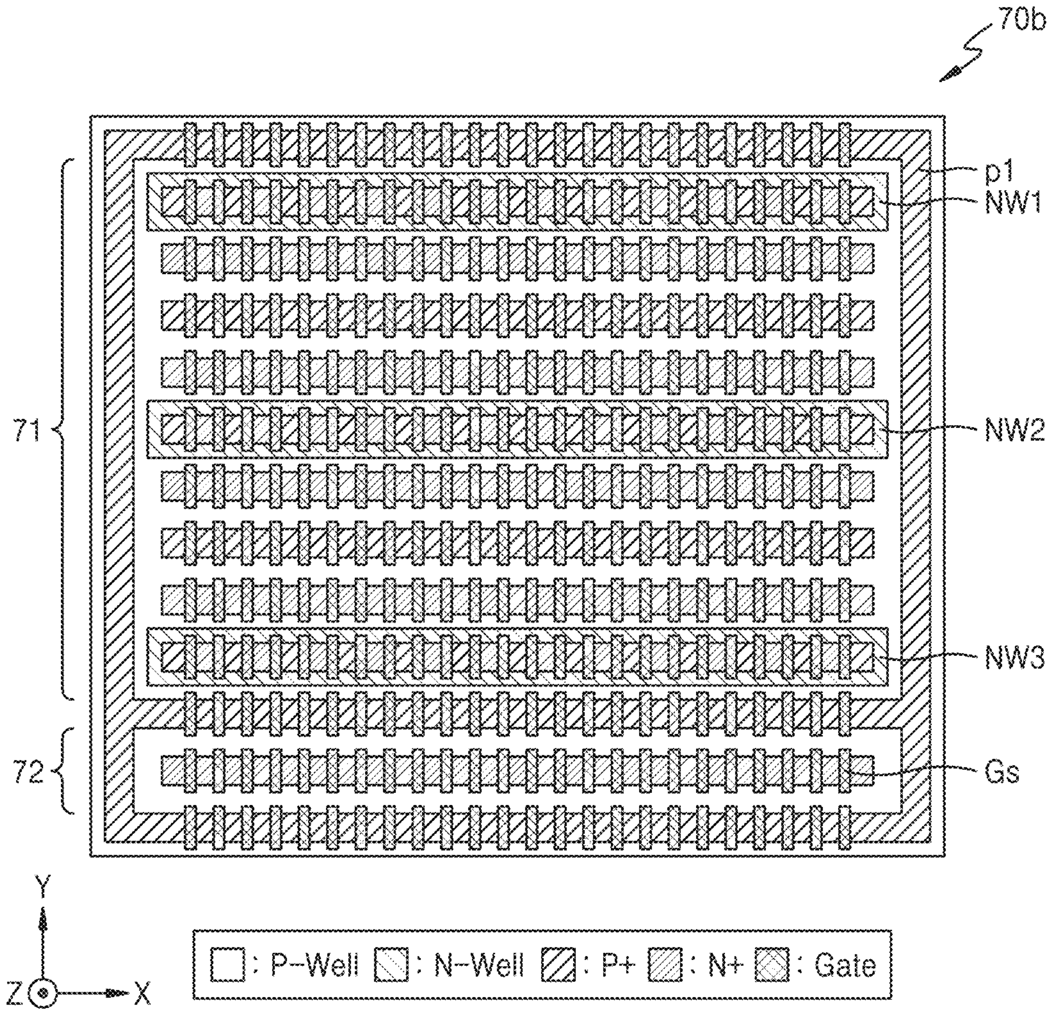

FIGS. 7A and 7B are diagrams illustrating examples of layouts of a device according to embodiments. For example, FIGS. 7A and 7B show examples of layouts in which the equivalent circuit 50 of FIG. 5 is implemented. Hereinafter, overlapping descriptions of FIGS. 7A and 7B are omitted.

In FIG. 7A, a layout 70*a* may include an SCR region 71 and an FET region 72. As shown in FIG. 7A, each of the SCR region 71 and the FET region 72 may be surrounded by a first p+ region p1 on the p-well. In the SCR region 71, the first to third n-wells NW1 to NW3 may extend in the X-axis direction. As described above with reference to FIG. 4, the n+ regions and p+ regions may be alternately disposed in the X-axis direction in each of the first to third n-wells NW1 to NW3, and thus each of the emitters of the PNP BJT may be split.

In the FET region 72, the first n+ region n1, the gate electrode G, and the second n+ region n2 may extend in the X-axis direction. The first n+ region n1, the gate electrode G, and the second n+ region n2 may correspond to the NFET Mn. In the example of FIG. 7A, the NFET Mn may be a planar transistor, and thus the gate electrode G may be disposed on a region between the first n+ region n1 and the second n+ region n2.

In FIG. 7B, a layout 70*b* may include an SCR region 71 and an FET region 72. As shown in FIG. 7B, each of the SCR region 71 and the FET region 72 may be surrounded by a first p+ region p1 on the p-well. In the SCR region 71, the first to third n-wells NW1 to NW3 may extend in the X-axis direction. As described above with reference to FIG. 4, the n+ regions and p+ regions may be alternately disposed in the X-axis direction in each of the first to third n-wells NW1 to NW3, and thus, each of the emitters of the PNP BJT may be split.

The layout 70*b* may include gate electrodes Gs extending in the Y-axis direction. For example, as shown in FIG. 7B, in the FET region 72, the gate electrodes Gs may extend in the Y-axis direction, and the gate electrodes Gs may form a plurality of NFETs connected in parallel with each other corresponding to the NFET Mn of FIG. 5. In the example of FIG. 7B, each of the plurality of NFETs may be a three-dimensional transistor. For example, as a non-limiting example, the NFET may include one of a FinFET formed by a gate electrode crossing a fin-shaped active pattern extending in the X-axis direction, a gate-all-around field effect transistor (GAAFET) including a nanowire as an active pattern passing through the gate electrode, a multi-bridge channel field effect transistor (MBCFET) including a nanosheet as an active pattern penetrating the gate electrode, and a vertical field effect transistor (VFET) including an active pattern passing through the gate electrode in a vertical direction.

In some embodiments, the layout 70*b* of FIG. 7B may include an MBCFET, and at least one nanosheet may pass through each of the gate electrodes Gs in the X-axis direction. The at least one nanosheet may be connected to doped regions (or diffusion regions) disposed on both sides of the gate electrode. Accordingly, the gate electrode may extend in the Y-axis direction between adjacent regions among the n+ regions and the p+ regions disposed in the first to third n-wells NW1 to NW3, respectively. In some embodiments, gate electrodes may be removed from regions except for the FET region 72.

Figure 8A:
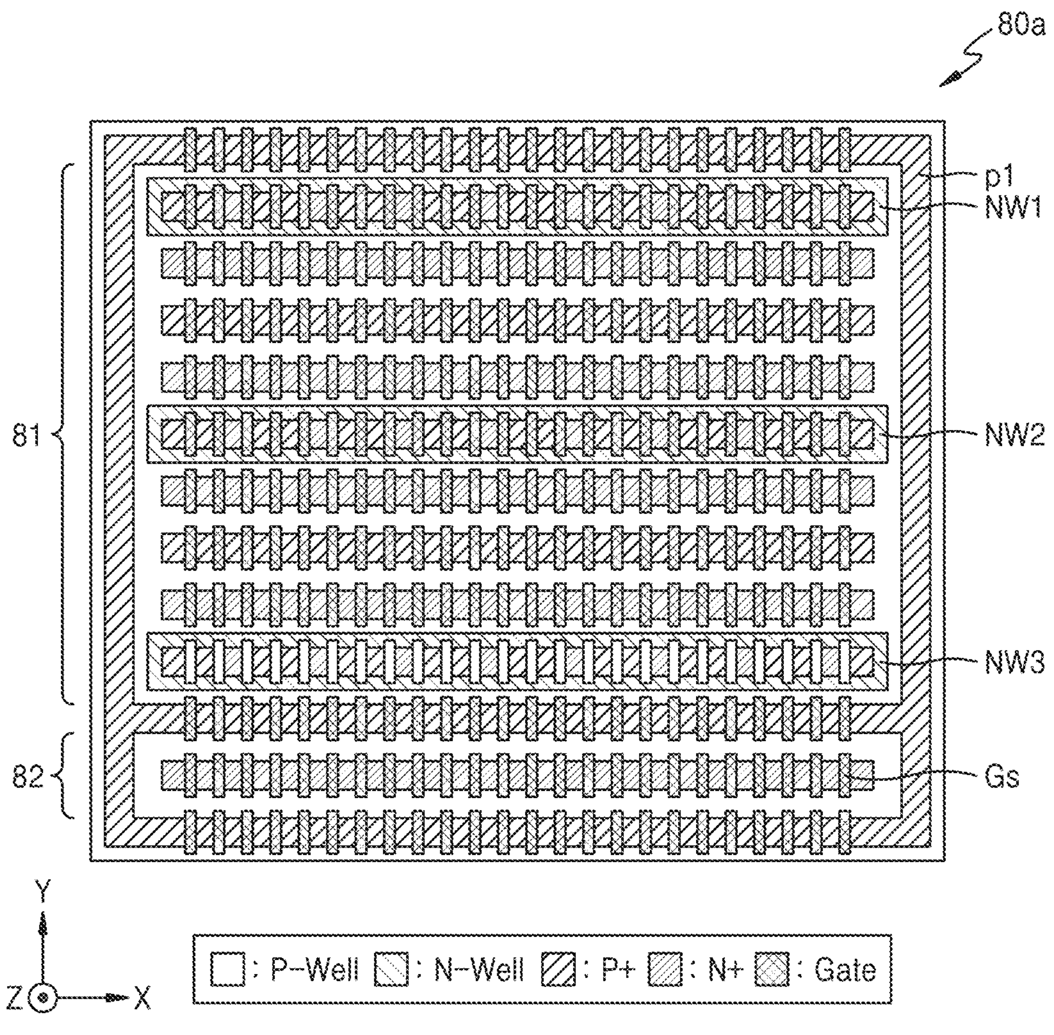
FIGS. 8A and 8B are diagrams illustrating examples of a layout of a device according to an embodiment.
Figure 8B:
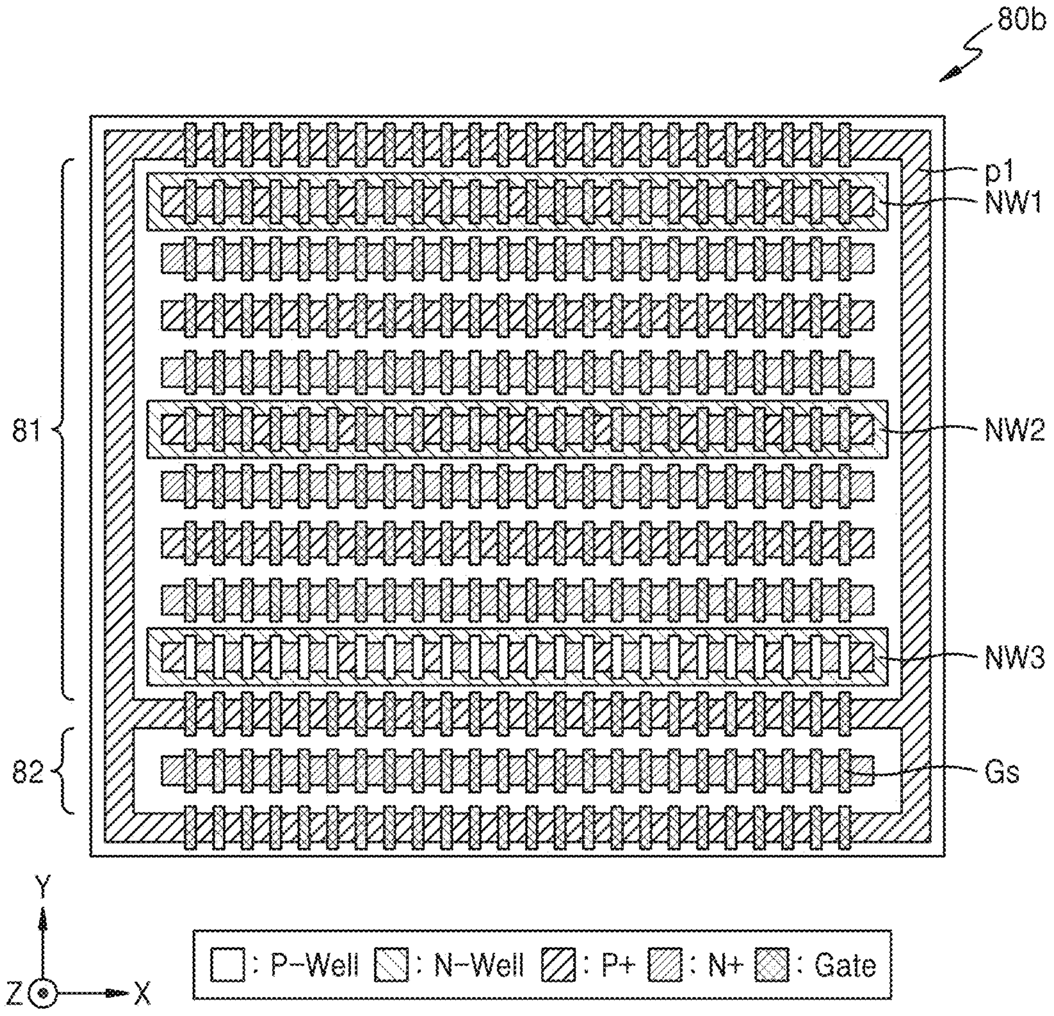
Figure 9:
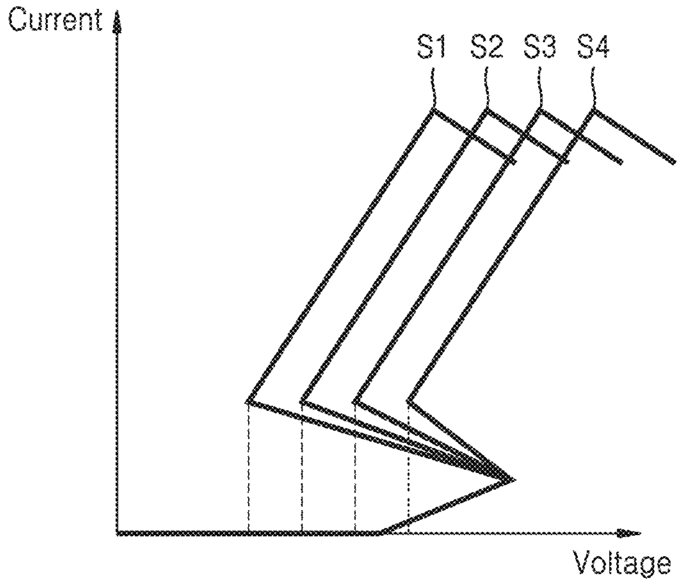
FIG. 9 is a graph showing characteristics of a device according to an embodiment.

FIGS. 8A and 8B are diagrams showing examples of layouts of a device according to embodiments, and FIG. 9 is a graph showing characteristics of a device according to an embodiment. For example, FIGS. 8A and 8B show examples of layouts in which the equivalent circuit 50 of FIG. 5 is implemented, and FIG. 9 shows snapback curves S1 to S4 corresponding to the equivalent circuit 50 of FIG. 5. Hereinafter, in the description of FIGS. 8A and 8B, descriptions previously given with reference to FIGS. 7A and 7B are omitted.

In FIGS. 8A and 8B, each of the layouts 80*a* and 80*b* may include an SCR region 81 and an FET region 82. Each of the SCR region 81 and the FET region 82 may be surrounded by a first p+ region p1 on the p-well. In the SCR region 81, first to third n-wells NW1 to NW3 may extend in the X-axis direction. In each of the first to third n-wells NW1 to NW3, the n+ regions and p+ regions may be alternately disposed in the X-axis direction, and accordingly, emitters of the PNP BJT may be split.

A ratio between the n+ regions and the p+ regions disposed in each of the first to third n-wells NW1 to NW3 may be determined according to required specifications. For example, in each of the first to third n-wells NW1 to NW3, as shown in FIG. 8A, more p+ regions than n+ regions may be disposed, and as shown in FIG. 8B, more n+ regions than p+ regions may be disposed.

FIG. 9 shows the first to fourth snapback curves S1 to S4 where, as the ratio of the n+ regions increases, a hold voltage and a leakage current may increase.

Figure 10:
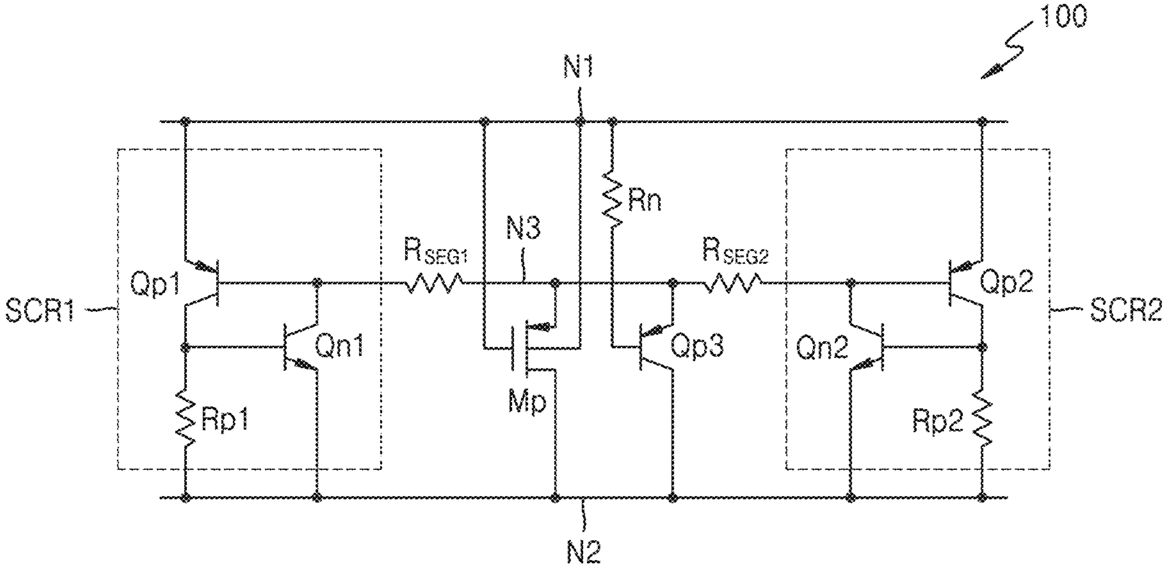
FIG. 10 is a circuit diagram showing an equivalent circuit of a device according to an embodiment.

FIG. 10 is a circuit diagram illustrating an equivalent circuit 100 of a device according to an embodiment. Compared to the equivalent circuit 50 of FIG. 5, the equivalent circuit 100 of FIG. 10 may include a p-channel field effect transistor (PFET) Mp as a trigger transistor. Hereinafter, in the description of FIG. 10, descriptions already given with reference to figures will be omitted.

In some embodiments, the equivalent circuit 100 may include first and second silicon-controlled rectifiers SCR1 and SCR2, a PFET Mp, a third PNP BJT Qp3, first and second segment resistors $R_{SEG1}$ and $R_{SEG2}$, and an n-well resistor Rn. The first silicon-controlled rectifier SCR1 may include a first PNP BJT Qp1, a first NPN BJT Qn1, and a first p-well resistor Rp1, and the second silicon-controlled rectifier SCR2 may include a second PNP BJTs Qp2, a second NPN BJT Qn2, and a second p-well resistor Rp2. When an electrostatic discharge occurs between the first node N1 and the second node N2, the PFET Mp may generate a trigger current, and thus, the first and second silicon-controlled rectifiers SCR1 and SCR2 may be early driven.

Figure 11:
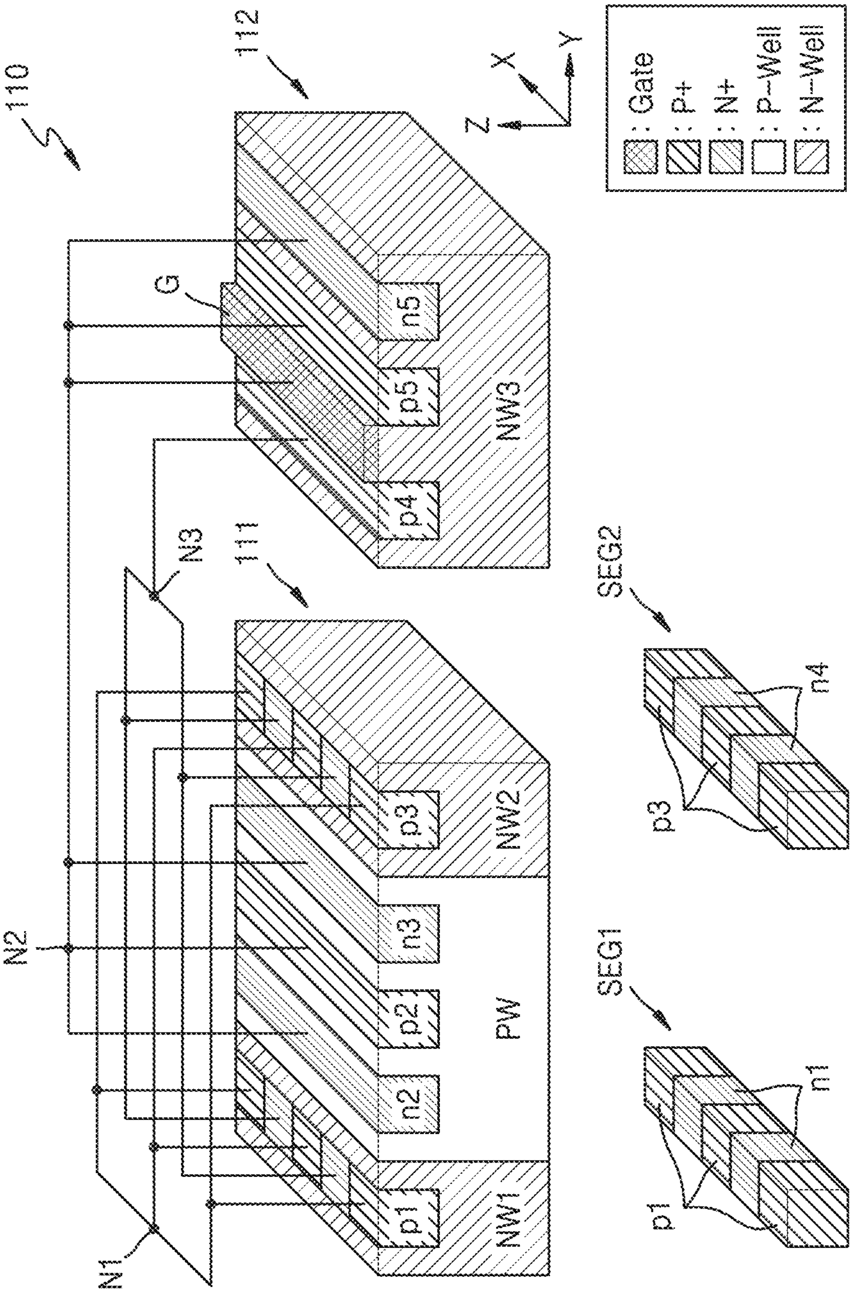
FIG. 11 is a diagram showing a layout of a device according to an embodiment.

FIG. 11 is a diagram illustrating a layout 110 of a device according to an embodiment. For example, FIG. 11 shows the layout 110 corresponding to the equivalent circuit 100 of FIG. 10. For convenience of illustration, contacts and conductive patterns for interconnecting the p+ regions, n+ regions, and gates are omitted. In FIG. 11, p+ regions and n+ regions respectively disposed in a first n-well NW1 and a second n-well NW2 are additionally shown at a bottom as a first segment SEG1 and a second segment SEG2. In some embodiments, the structure of FIG. 11 may be formed in a p-type substrate, and the first p-well PW1 and the second p-well PW2 may correspond to the p-type substrate. Hereinafter, in the description of FIG. 11, descriptions previously given with reference to the drawings are omitted.

In FIG. 11, the layout 110 may include an SCR structure 111 and a FET structure 112. The SCR structure 111 may include first and second n-wells NW1 and NW2 and a p-well PW extending in the X-axis direction. As shown in FIG. 11, the first n-well NW1 and the second n-well NW2 may be adjacent to the p-well PW in the Y-axis direction. The first segment SEG1 may be disposed in the first n-well NW1, and the first segment SEG1 may include first p+ regions p1 and first n+ regions n1. As shown in FIG. 11, the first p+ regions p1 may be spaced apart from each other in the X-axis direction, and the first n+ regions n1 may be disposed between the first p+ regions p1. The first p+ regions p1 may be electrically connected to a first node N1, and the first n+ regions n1 may be electrically connected to a third node N3. A second n+ region n2, a second p+ region p2, and a third n+ region n3 may be disposed in the p-well PW. The second n+ region n2, the second p+ region p2, and the third n+ region n3 may be electrically connected to a second node N2. The second segment SEG2 may be disposed in the second n-well NW2, and the second segment SEG2 may include third p+ regions p3 and fourth n+ regions n4. As shown in FIG. 11, the third p+ regions p3 may be spaced apart from each other in the X-axis direction, and the fourth n+ regions n4 may be disposed between the third p+ regions p3. The third p+ regions p3 may be electrically connected to the first node N1, and the fourth n+ regions n4 may be electrically connected to the third node N3.

The FET structure 112 may include a third n-well NW3 extending in the X-axis direction. A fourth p+ region p4, a fifth p+ region p5, and a fifth n+ region n5 may be disposed in the third n-well NW3, and a gate electrode G may be disposed on a region between the fourth p+ region p4 and the fifth p+ region p5. The fourth p+ region p4 may be electrically connected to the third node N3, and the fifth p+ region p5, the fifth n+ region n5, and the gate electrode G may be electrically connected to the second node N2. The fourth p+ region p4, the fifth p+ region p5, and the gate electrode G may correspond to the PFET Mp of FIG. 10, and thus, the PFET Mp may be connected to two silicon-controlled rectifiers, that is, the first and second silicon-controlled rectifiers SCR1 and SCR2 of FIG. 10, respectively through the first n+ regions n1 and the fourth n+ regions n4 connected to the third node N3.

The first PNP BJT Qp1 of FIG. 10 may include an emitter corresponding to the first p+ regions p1, a base corresponding to the first n-well NW1, and a collector corresponding to the p-well PW. The first NPN BJT Qn1 may include a collector corresponding to the first n-well NW1, a base corresponding to the p-well PW, and an emitter corresponding to the second n+ region n2. The second PNP BJT Qp2 may include an emitter corresponding to the second p+ regions p2, a base corresponding to the second n-well NW2, and a collector corresponding to the p-well PW. The second NPN BJT Qn2 may include a collector corresponding to the second n-well NW2, a base corresponding to the p-well PW, and an emitter corresponding to the third n+ region n3. The first segment resistor $R_{SEG1}$ may correspond to a resistor between the first n-well NW1 and the first n+ regions n1, and the second segment resistor $R_{SEG2}$ may correspond to a resistor between the second n-well NW2 and the fourth n+ regions n4. Also, the first p-well resistor Rp1 and the second p-well resistor Rp2 may respectively correspond to resistors between the p-well PW and the second p+ region p2.

The PFET Mp may include a source corresponding to the fourth p+ region p4, a gate corresponding to the gate electrode G, and a drain corresponding to the fifth p+ region p5. The third PNP BJT Qp3 may include a collector corresponding to the fourth p+ region p4, a base corresponding to the third n-well NW3, and an emitter corresponding to the fifth p+ region p5. The n-well resistor Rn of FIG. 10 may correspond to a resistor between the second n-well NW2 and the fifth n+ region n5.

Figure 12:
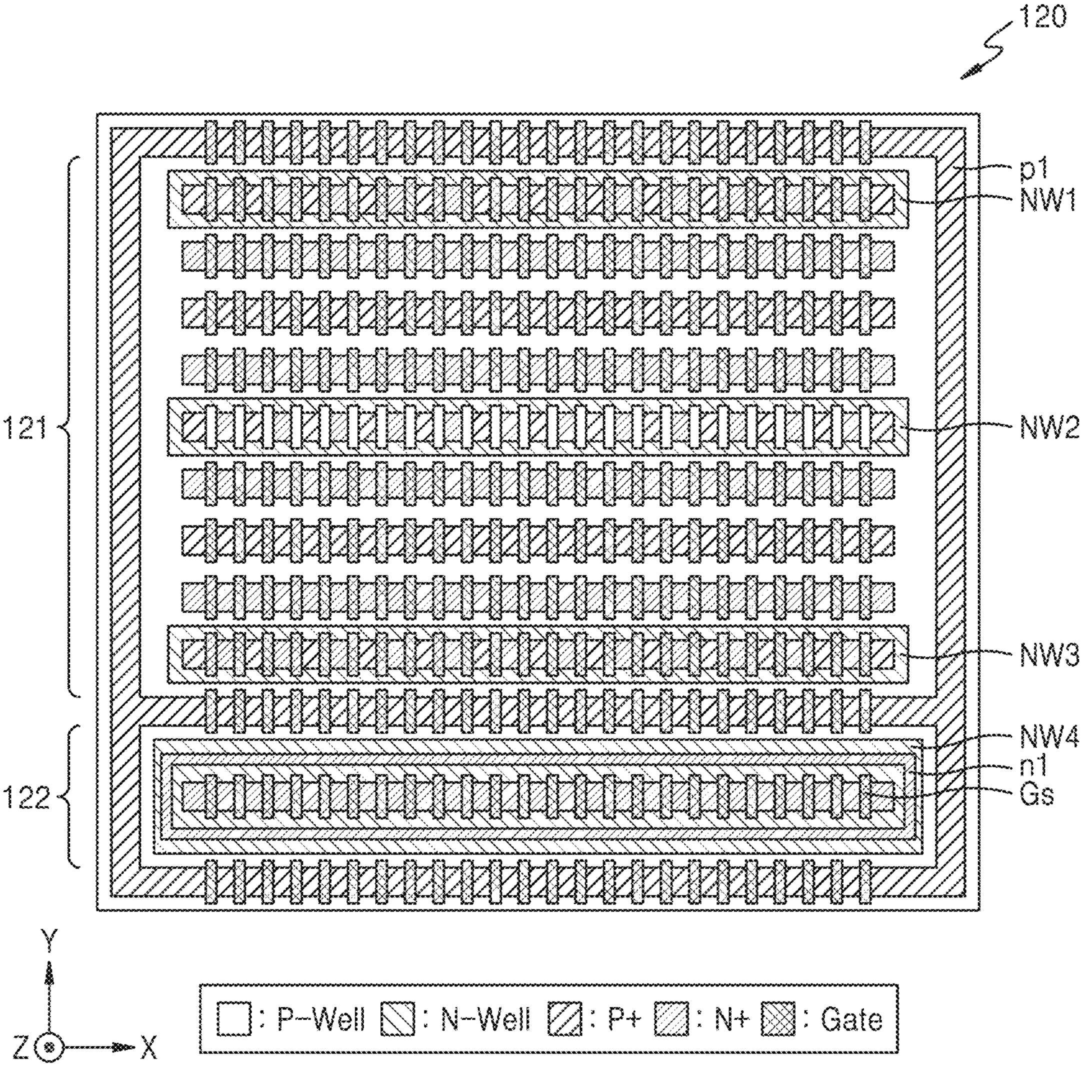
FIG. 12 is a diagram illustrating a layout of a device according to an embodiment.

FIG. 12 is a diagram illustrating a layout 120 of a device according to an embodiment. For example, FIG. 12 shows an example of a layout in which the equivalent circuit 100 of FIG. 10 is implemented. Hereinafter, in the description of FIG. 12, descriptions previously given with reference to the drawings are omitted.

In FIG. 12, the layout 120 may include an SCR region 121 and a FET region 122. As shown in FIG. 12, each of the SCR region 121 and the FET region 122 may be surrounded by a first p+ region p1 on the p-well. In the SCR region 121, the first to third n-wells NW1 to NW3 may extend in the X-axis direction. As described above with reference to FIG. 11, n+ regions and p+ regions may be alternately disposed in the X-axis direction in each of the first to third n-wells NW1 to NW3, and thus, each of emitters of the PNP BJT may be split.

In the FET region 122, a fourth n-well NW4 may extend in the X-axis direction, and a plurality of PFETs that are connected in parallel to each other and correspond to the PFET Mp of FIG. 10 may be disposed in the fourth n-well NW4. For example, the layout 120 may include an MBCFET, and at least one nanosheet may pass through each of the gate electrodes Gs in the X-axis direction. The first n+ region n1 may surround the plurality of PFETs on the fourth n-well NW4.

Figure 13:
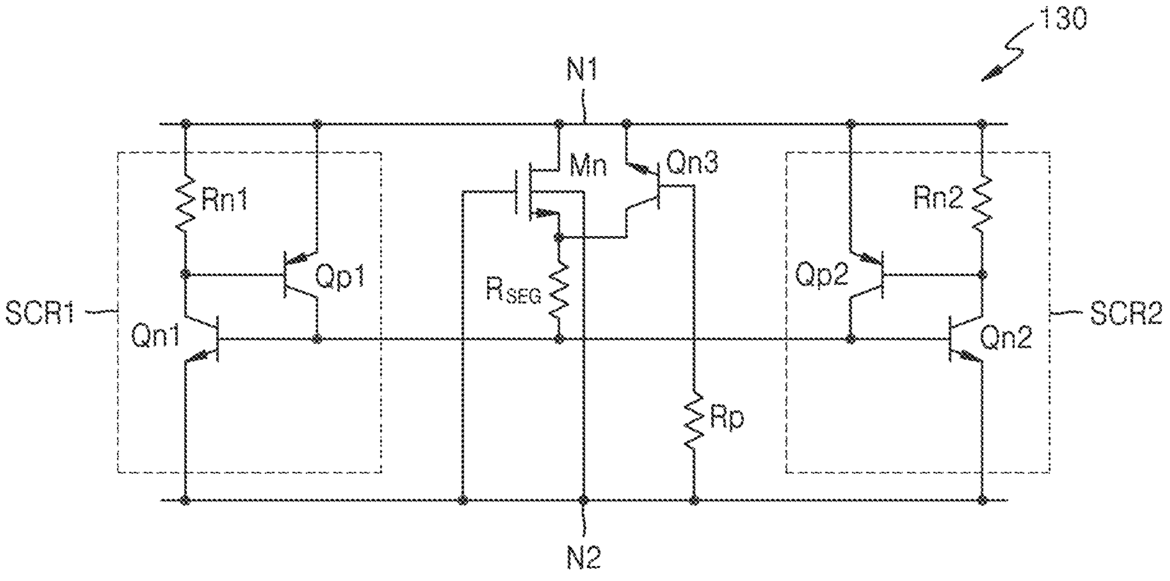
FIG. 13 is a circuit diagram showing an equivalent circuit of a device according to an embodiment.

FIG. 13 is a circuit diagram illustrating an equivalent circuit 130 of a device according to an embodiment. Compared to the equivalent circuit 50 of FIG. 5, in the equivalent circuit 130 of FIG. 13, instead of the PNP BJT transistor, the NPN BJT transistor may include split emitters. Hereinafter, in the description of FIG. 13, descriptions previously given with reference to the drawings are omitted.

The equivalent circuit 130 may include first and second silicon-controlled rectifiers SCR1 and SCR2, an NFET Mn, a third NPN BJT Qn3, a segment resistor $R_{SEG}$, and a p-well resistor Rp. The first silicon-controlled rectifier SCR1 may include a first PNP BJT Qp1, a first NPN BJT Qn1 and a first n-well resistor Rn1, and the second silicon-controlled rectifier SCR2 may include second PNP BJT Qp2, a second NPN BJT Qn2, and a second n-well resistor Rn2. When an electrostatic discharge occurs between the first node N1 and the second node N2, the NFET Mn may generate a trigger current, and thus, the first and second silicon-controlled rectifiers SCR1 and SCR2 may be early driven.

Figure 14:
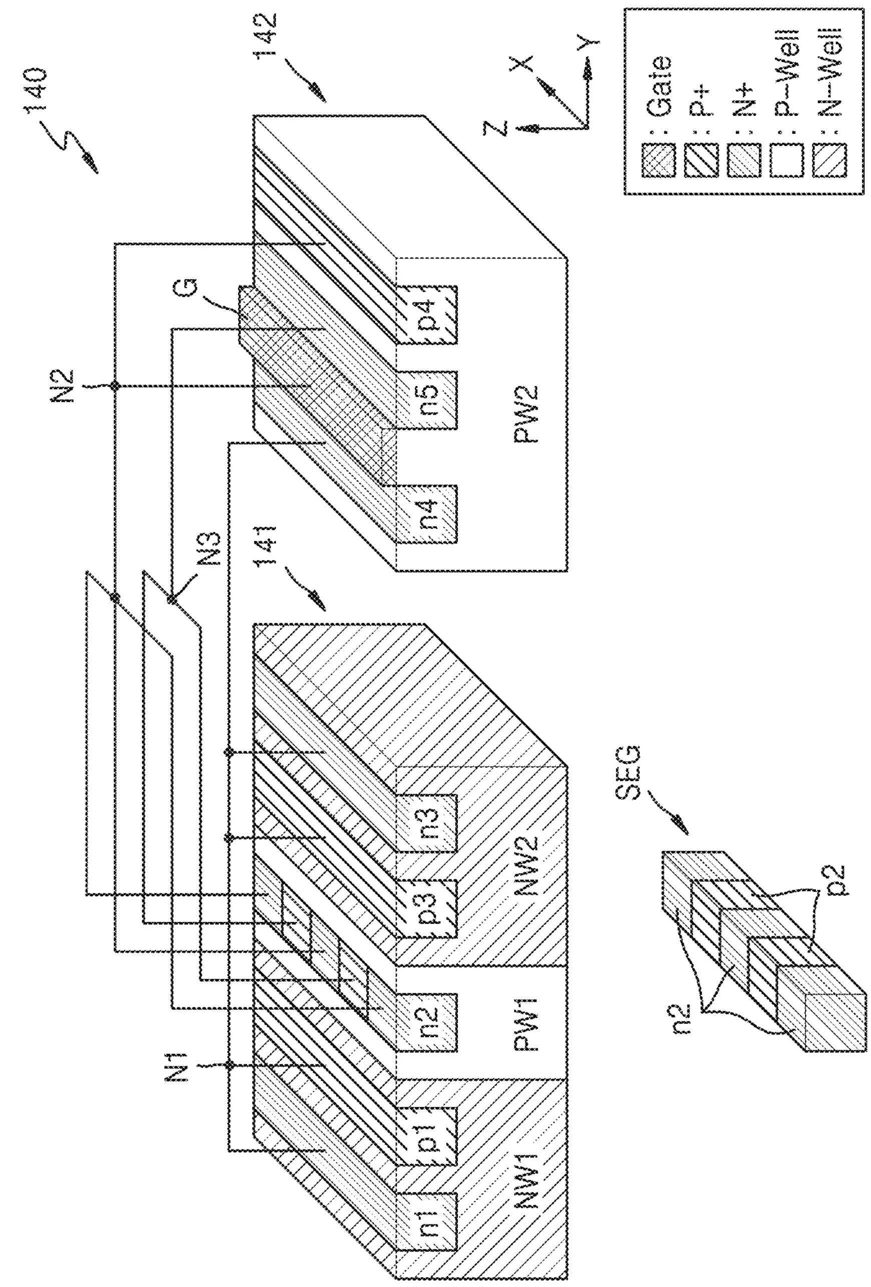
FIG. 14 is a diagram illustrating a layout of a device according to an embodiment.

FIG. 14 is a diagram illustrating a layout 140 of a device according to an embodiment. For example, FIG. 14 shows the layout 140 corresponding to the equivalent circuit 130 of FIG. 13. For convenience of illustration, contacts and conductive patterns for interconnecting the p+ regions, n+ regions, and gates are omitted. In FIG. 14, p+ regions and n+ regions disposed in a first p-well PW1 are additionally shown at the bottom as a segment SEG. In some embodiments, the structure of FIG. 14 may be formed in a p-type substrate, and the first p-well PW1 and the second p-well PW2 may correspond to the p-type substrate. Hereinafter, in the description of FIG. 14, descriptions previously given with reference to the drawings are omitted.

In FIG. 14, the layout 140 may include an SCR structure 141 and a FET structure 142. The SCR structure 141 may include first and second n-wells NW1 and NW2 and a first p-well PW1 extending in the X-axis direction. As shown in FIG. 14, the first n-well NW1 and the second n-well NW2 may be adjacent to the first p-well PW1 in the Y-axis direction. The segment SEG may be disposed in the first p-well PW1, and the segment SEG may include second n+ regions n2 and second p+ regions p2. As shown in FIG. 14, the second n+ regions n2 may be spaced apart from each other in the X-axis direction, and the second p+ regions p2 may be disposed between the second n+ regions n2. The second n+ regions n2 may be electrically connected to a second node N2, and the second p+ regions p2 may be electrically connected to a third node N3. A first n+ region n1 and a first p+ region p1 may be disposed in the first n-well NW1, and the first n+ region n1 and the first p+ region p1 may be electrically connected to the first node N1. In addition, a third p+ region p3 and a third n+ region n3 may be disposed in the second n-well NW2, and the third p+ region p3 and the third n+ region n3 may be electrically connected to the first node N1.

The FET structure 142 may include a second p-well PW2 extending in the X-axis direction. A fourth n+ region n4, a fifth n+ region n5, and a fourth p+ region p4 may be disposed in the second p-well PW2, and a gate electrode G may be disposed on a region between the fourth n+ region n4 and the fifth n+ region n5. The fourth n+ region n4 may be electrically connected to the first node N1, the gate electrode G and the fourth p+ region p4 may be electrically connected to the second node N2, and the fifth n+ region n5 may be electrically connected to the third node N3. The fourth n+ region n4, the fifth n+ region n5, and the gate electrode G may correspond to the NFET Mn of FIG. 13, and thus, the NFET Mn may be connected to two silicon-controlled rectifiers, that is, the first and second silicon-controlled rectifiers SCR1 and SCR2 of FIG. 13, respectively, through the second p+ regions p2 connected to the third node N3.

The first PNP BJT Qp1 of FIG. 13 may include an emitter corresponding to the first p+ region p1, a base corresponding to the first n-well NW1, and a collector corresponding to the first p-well PW1. The first NPN BJT Qn1 may include a collector corresponding to the first n-well NW1, a base corresponding to the first p-well PW1, and an emitter corresponding to the second n+ regions n2. The second PNP BJT Qp2 may include an emitter corresponding to the third p+ region p3, a base corresponding to the second n-well NW2, and a collector corresponding to the first p-well PW1. The second NPN BJT Qn2 may include a collector corresponding to the second n-well NW2, a base corresponding to the first p-well PW1, and an emitter corresponding to the second n+ regions n2. The segment resistor $R_{SEG}$ may correspond to a resistor between the first p-well PW1 and the second p+ regions p2. In addition, the first n-well resistor Rn1 may correspond to a resistor between the first n-well NW1 and the first n+ region n1, and the second n-well resistor Rn2 may correspond to a resistor between the second n-well NW2 and the third n+ region n3.

The NFET Mn may include a drain corresponding to the fourth n+ region n4, a gate corresponding to the gate electrode G, and a source corresponding to the fifth n+ region n5. The third NPN BJT Qn3 may include a collector corresponding to the fourth n+ region n4, a base corresponding to the second p-well PW2, and an emitter corresponding to the fifth n+ region n5. The p-well resistor Rp of FIG. 13 may correspond to a resistor between the second p-well PW2 and the fourth p+ region p4.

Figure 15:
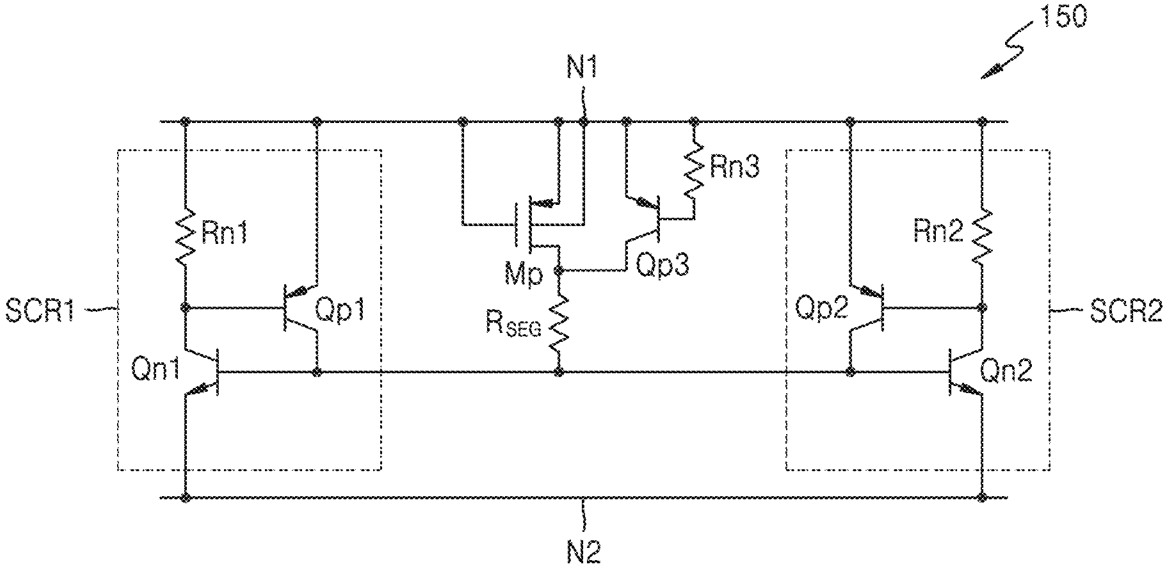
FIG. 15 is a circuit diagram showing an equivalent circuit of a device according to an embodiment.

FIG. 15 is a circuit diagram illustrating an equivalent circuit 150 of a device according to an embodiment. Compared to the equivalent circuit 130 of FIG. 13, the equivalent circuit 150 of FIG. 15 may include a PFET Mp instead of an NFET. Hereinafter, in the description of FIG. 15, descriptions previously given with reference to the drawings are omitted.

The equivalent circuit 150 may include first and second silicon-controlled rectifiers SCR1 and SCR2, a PFET Mp, a third PNP BJT Qp3, a segment resistor $R_{SEG}$, and a third n-well resistor Rn3. The first silicon-controlled rectifier SCR1 may include a first PNP BJT Qp1, a first NPN BJT Qn1, and a first n-well resistor Rn1, and the second silicon-controlled rectifier SCR2 may include a second PNP BJT Qp2, a second NPN BJT Qn2, and a second n-well resistor Rn2. When an electrostatic discharge occurs between the first node N1 and the second node N2, the PFET Mp may generate a trigger current, and thus, the first and second silicon-controlled rectifiers SCR1 and SCR2 may be driven early.

Figure 16:
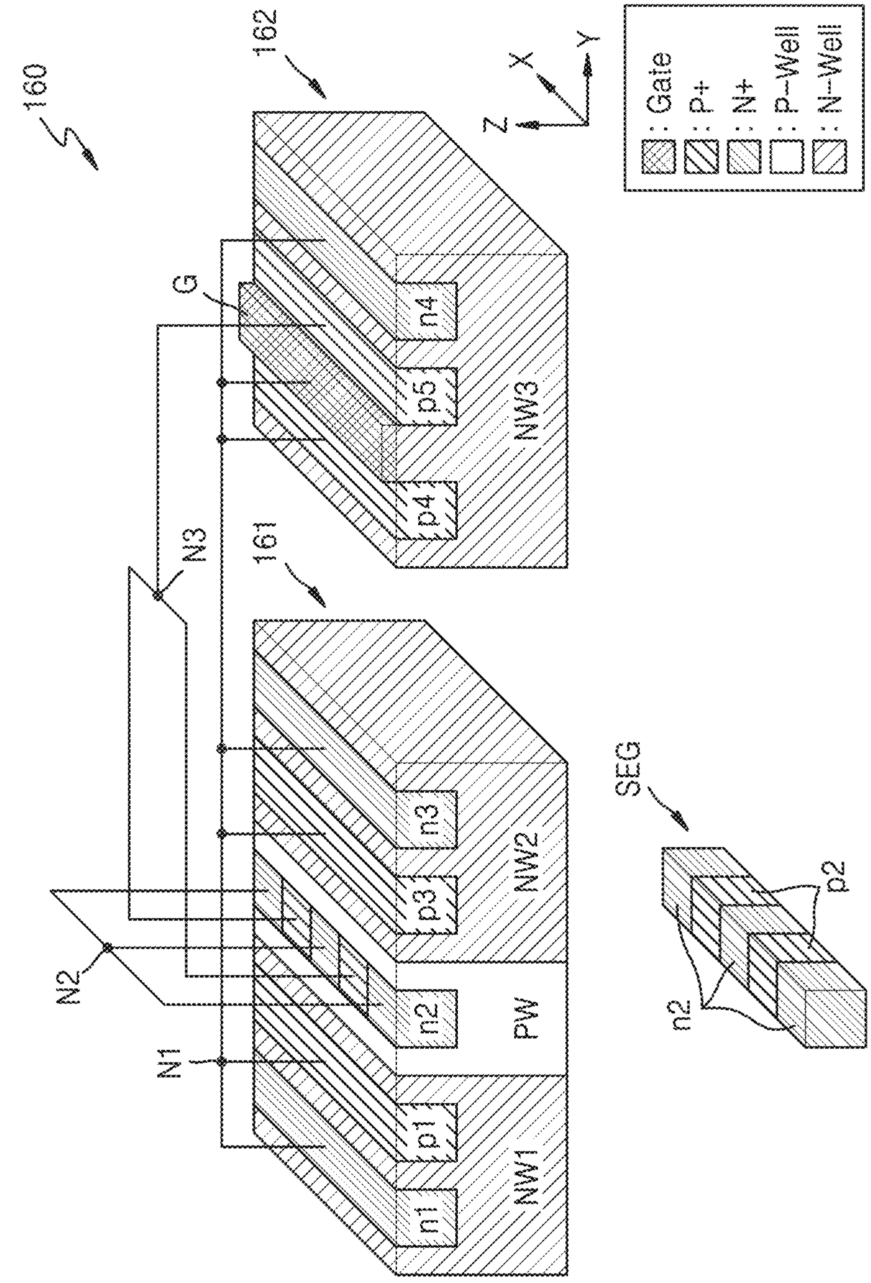
FIG. 16 is a diagram illustrating a layout of a device according to an embodiment.

FIG. 16 is a diagram illustrating a layout 160 of a device according to an embodiment. For example, FIG. 16 shows the layout 160 corresponding to the equivalent circuit 150 of FIG. 15. For convenience of illustration, contacts and conductive patterns for interconnecting the p+ regions, n+ regions, and gates are omitted. In FIG. 16, p+ regions and n+ regions disposed in a p-well PW are additionally shown at a bottom as a segment SEG. In some embodiments, the structure of FIG. 16 may be formed in a p-type substrate, and the p-well PW may correspond to the p-type substrate. Hereinafter, in the description of FIG. 16, descriptions previously given with reference to the drawings are omitted.

In FIG. 16, the layout 160 may include an SCR structure 161 and a FET structure 162. The SCR structure 161 may include first and second n-wells NW1 and NW2 and a p-well PW extending in the X-axis direction. As shown in FIG. 16, the first n-well NW1 and the second n-well NW2 may be adjacent to the p-well PW in the Y-axis direction. The segment SEG may be disposed in the p-well PW, and the segment SEG may include second n+ regions n2 and second p+ regions p2. As shown in FIG. 16, the second n+ regions n2 may be spaced apart from each other in the X-axis direction, and the second p+ regions p2 may be disposed between the second n+ regions n2. The second n+ regions n2 may be electrically connected to a second node N2, and the second p+ regions p2 may be electrically connected to a third node N3. A first n+ region n1 and a first p+ region p1 may be disposed in the first n-well NW1, and the first n+ region n1 and the first p+ region p1 may be electrically connected to a first node N1. In addition, a third p+ region p3 and a third n+ region n3 may be disposed in the second n-well NW2, and the third p+ region p3 and the third n+ region n3 may be electrically connected to a first node N1.

The FET structure 162 may include a third n-well NW3 extending in the X-axis direction. A fourth p+ region p4, a fifth p+ region p5, and a fourth n+ region n4 may be disposed in the third n-well NW3, and a gate electrode G may be disposed on a region between the fourth p+ region p4 and the fifth p+ region p5. The fourth p+ region n4, the gate electrode G, and the fourth n+ region n4 may be electrically connected to the first node N1, and the fifth p+ region p5 may be electrically connected to the third node N3. The fourth p+ region p4, the fifth p+ region p5, and the gate electrode G may correspond to the PFET Mp of FIG.

15, and thus, the PFET Mp may be connected to two silicon-controlled rectifiers, that is, the first and second silicon-controlled rectifiers SCR1 and SCR2 of FIG. 15, respectively, through the second p+ regions p2 connected to the third node N3.

The first PNP BJT Qp1 of FIG. 15 may include an emitter corresponding to the first p+ region p1, a base corresponding to the first n-well NW1, and a collector corresponding to the p-well PW. The first NPN BJT Qn1 may include a collector corresponding to the first n-well NW1, a base corresponding to the p-well PW, and an emitter corresponding to the second n+ regions n2. The second PNP BJT Qp2 may include an emitter corresponding to the third p+ region p3, a base corresponding to the second n-well NW2, and a collector corresponding to the p-well PW. The second NPN BJT Qn2 may include a collector corresponding to the second n-well NW2, a base corresponding to the p-well PW, and an emitter corresponding to the second n+ regions n2. The segment resistor $R_{SEG}$ may correspond to a resistor between the p-well PW and the second p+ regions p2. In addition, the first n-well resistor Rn1 may correspond to a resistor between the first n-well NW1 and the first n+ region n1, and the second n-well resistor Rn2 may correspond to a resistor between the second n-well NW2 and the third n+ region n3.

The PFET Mp may include a source corresponding to the fourth p+ region p4, a gate corresponding to the gate electrode G, and a drain corresponding to the fifth p+ region p5. The third PNP BJT Qp3 may include an emitter corresponding to the fourth p+ region p4, a base corresponding to the third n-well NW3, and a collector corresponding to the fifth p+ region p5. The third n-well resistor Rn3 of FIG. 15 may correspond to a resistor between the third n-well NW3 and the fourth n+ region n4.

Figure 17:
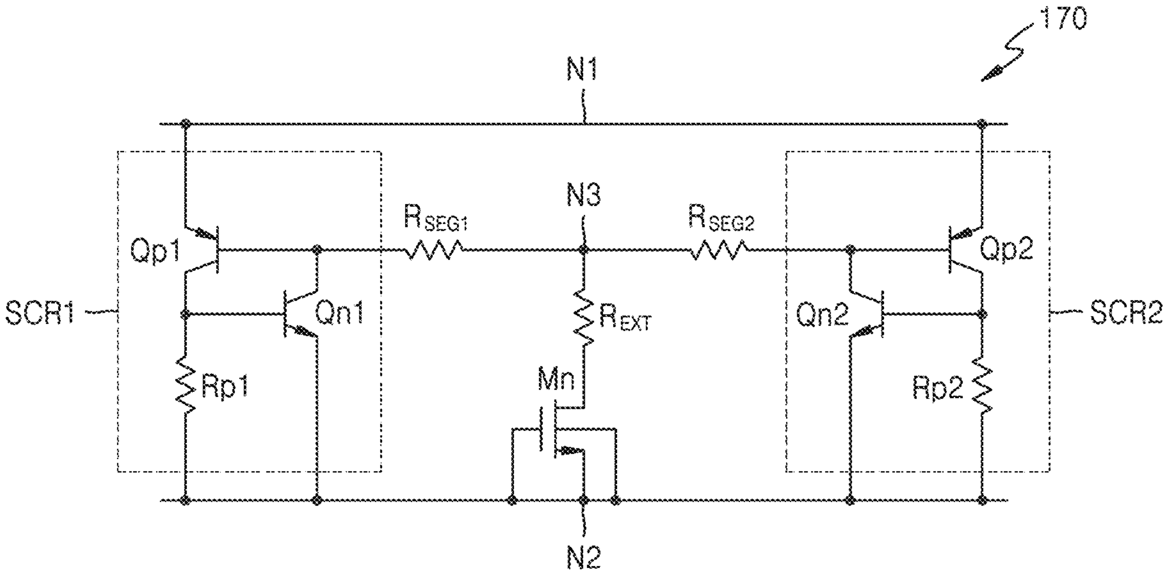
FIG. 17 is a circuit diagram showing an equivalent circuit of a device according to an embodiment.

FIG. 17 is a circuit diagram illustrating an equivalent circuit 170 of a device according to an embodiment. Compared to the equivalent circuit 50 of FIG. 5, the equivalent circuit 170 of FIG. 17 may include an external resistor $R_{EXT}$. It is noted that an external resistor $R_{EXT}$ may be added to other embodiments as well as to the equivalent circuit 170 of FIG. 17. Hereinafter, in the description of FIG. 17, descriptions previously given with reference to the drawings are omitted.

The equivalent circuit 170 may include first and second silicon-controlled rectifiers SCR1 and SCR2, an NFET Mn, and first and second segment resistors $R_{SEG1}$ and $R_{SEG2}$. The first silicon-controlled rectifier SCR1 may include a first PNP BJT Qp1, a first NPN BJT Qn1, and a first p-well resistor Rp1, and the second silicon-controlled rectifier SCR2 may include a second PNP BJTs Qp2, a second NPN BJT Qn2, and a second p-well resistor Rp2. When an electrostatic discharge occurs between the first node N1 and the second node N2, the NFET Mn may generate a trigger current, and thus, the first and second silicon-controlled rectifiers SCR1 and SCR2 may be driven early. A resistance of a path through which a leakage current flows may be increased or adjusted through the external resistor $R_{EXT}$.

Figure 18:
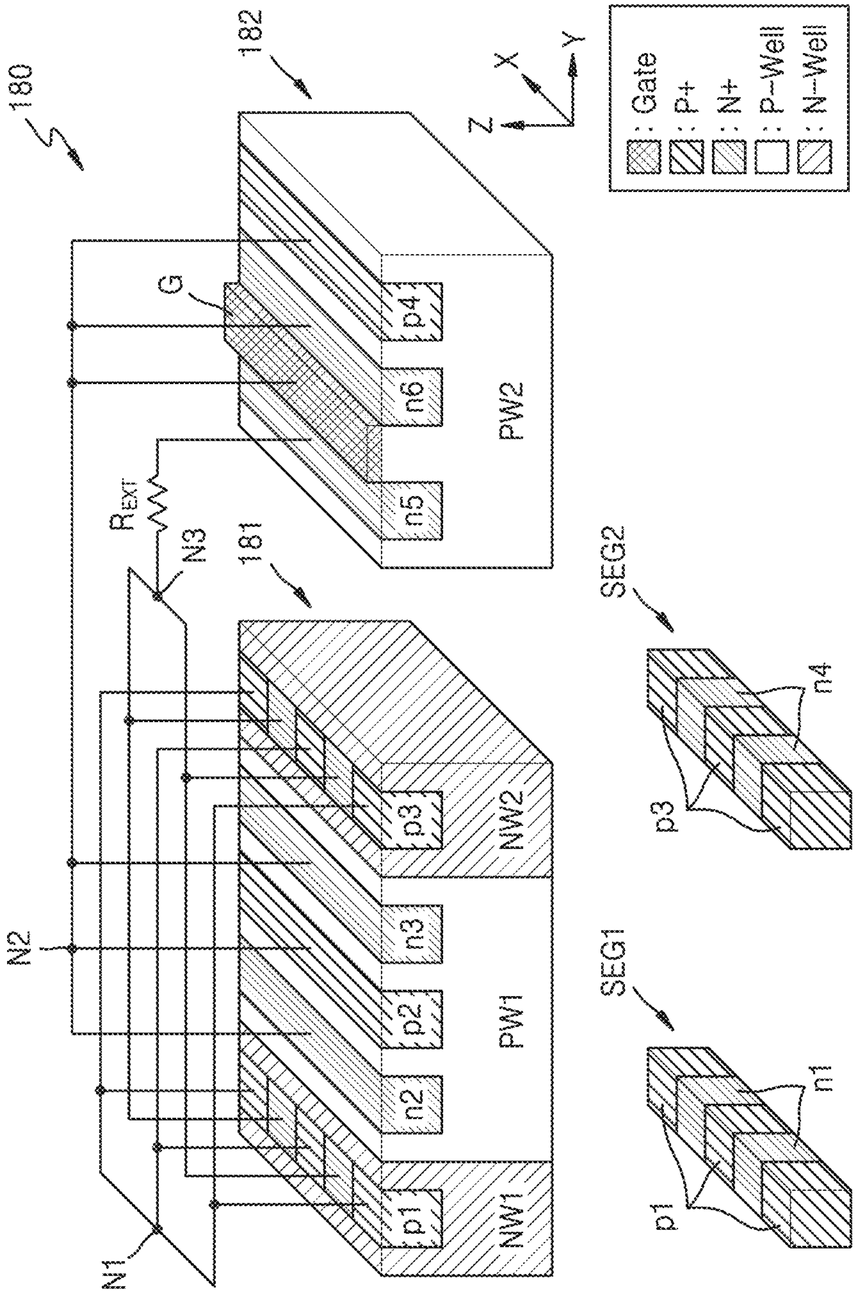
FIG. 18 is a diagram showing a layout of a device according to an embodiment.

FIG. 18 is a diagram illustrating a layout 180 of a device according to an embodiment. For example, FIG. 18 shows the layout 180 corresponding to the equivalent circuit 170 of FIG. 17. For convenience of illustration, contacts and conductive patterns for interconnecting the p+ regions, n+ regions, and gates are omitted. In FIG. 18, p+ regions and n+ regions respectively disposed in a first n-well NW1 and a second n-well NW2 are additionally shown at a bottom as a first segment SEG1 and a second segment SEG2 . . . . In some embodiments, the structure of FIG. 18 may be formed in a p-type substrate, and the first p-well PW1 and the second p-well PW2 may correspond to the p-type substrate. Hereinafter, in the description of FIG. 18, descriptions previously given with reference to the drawings are omitted.

In FIG. 18, the layout 180 may include an SCR structure 181 and a FET structure 182. The SCR structure 181 may include first and second n-wells NW1 and NW2 and a first p-well PW1 extending in the X-axis direction. As shown in FIG. 18, the first n-well NW1 and the second n-well NW2 may be adjacent to the first p-well PW1 in the Y-axis direction. The first segment SEG1 may be disposed in the first n-well NW1, and the first segment SEG1 may include first p+ regions p1 and first n+ regions n1. As shown in FIG. 18, the first p+ regions p1 may be spaced apart from each other in the X-axis direction, and the first n+ regions n1 may be disposed between the first p+ regions p1. The first p+ regions p1 may be electrically connected to a first node N1, and the first n+ regions n1 may be electrically connected to a third node N3. A second n+ region n2, a second p+ region p2, and a third n+ region n3 may be disposed in the first p-well PW1. The second n+ region n2, the second p+ region p2, and the third n+ region n3 may be electrically connected to a second node N2. The second segment SEG2 may be disposed in the second n-well NW2, and the second segment SEG2 may include third p+ regions p3 and fourth n+ regions n4. As shown in FIG. 18, the third p+ regions p3 may be spaced apart from each other in the X-axis direction, and the fourth n+ regions n4 may be disposed between the third p+ regions p3. The third p+ regions p3 may be electrically connected to the first node N1, and the fourth n+ regions n4 may be electrically connected to the third node N3.

The FET structure 182 may include a second p-well PW2 extending in the X-axis direction. A fifth n+ region n5, a sixth n+ region n6, and a fourth p+ region p4 may be disposed in the second p-well PW2, and a gate electrode G may be disposed on a region between the fifth n+ region n5 and the sixth n+ region n6. The fifth n+ region n5 may be electrically connected to the third node N3 through the external resistor $R_{EXT}$. The gate electrode G, the sixth n+ region n6, and the fourth p+ region p4 may be electrically connected to the second node N2. The fifth n+ region n5, the sixth n+ region n6, and the gate electrode G may correspond to the NFET Mn of FIG. 17, and thus, the NFET Mn may be connected to two silicon-controlled rectifiers, that is, the first and second silicon-controlled rectifiers SCR1 and SCR2 of FIG. 17, respectively, through the external resistor $R_{EXT}$, the first n+ regions n1, and the fourth n+ regions n4 connected to the third node N3.

The first PNP BJT Qp1 of FIG. 17 includes an emitter corresponding to the first p+ regions p1, a base corresponding to the first n-well NW1, and a collector corresponding to the first p-well PW1. The first NPN BJT Qn1 may include a collector corresponding to the first n-well NW1, a base corresponding to the first p-well PW1, and an emitter corresponding to the second n+ region n2. The second PNP BJT Qp2 may include an emitter corresponding to the second p+ regions p2, a base corresponding to the second n-well NW2, and a collector corresponding to the first p-well PW1. The second NPN BJT Qn2 may include a collector corresponding to the second n-well NW2, a base corresponding to the first p-well PW1, and an emitter corresponding to the third n+ region n3. The first segment resistor $R_{SEG1}$ may correspond to a resistor between the first n-well NW1 and the first n+ regions n1, and the second segment resistor $R_{SEG2}$ may correspond to a resistor between the second n-well NW2 and the fourth n+ regions n4. Also, the first p-well resistor Rp1 and the second p-well resistor Rp2 may respectively correspond to resistors between the first p-well PW1 and the second p+ region p2. The NFET Mn may include a drain corresponding to the fifth n+ region n5, a gate corresponding to the gate electrode G, and a source corresponding to the sixth n+ region n6.

Figure 19:
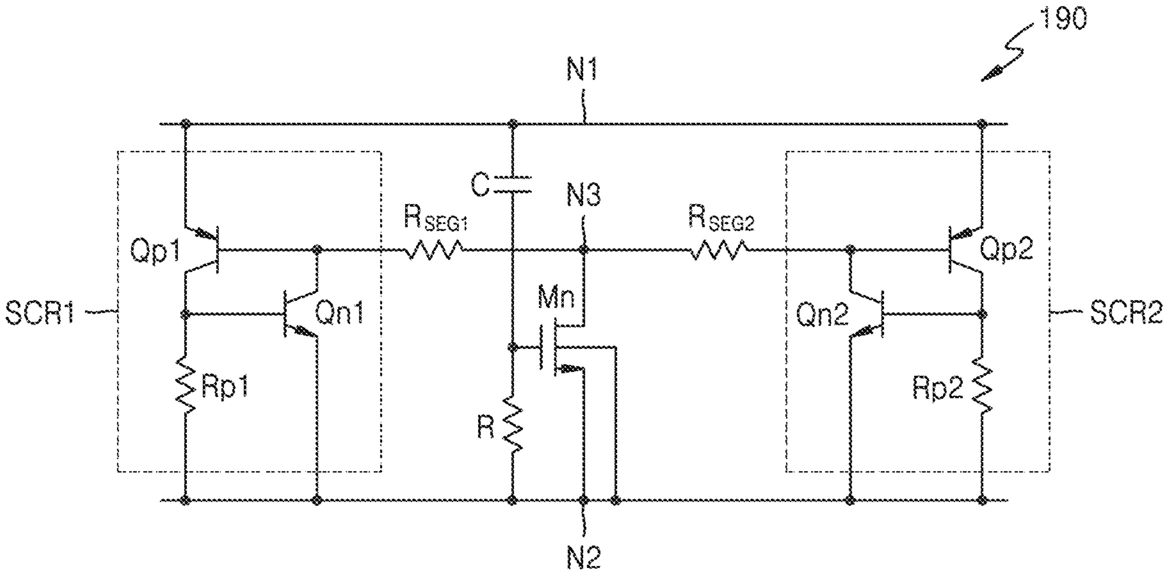
FIG. 19 is a circuit diagram showing an equivalent circuit of a device according to an embodiment.
Figure 20:
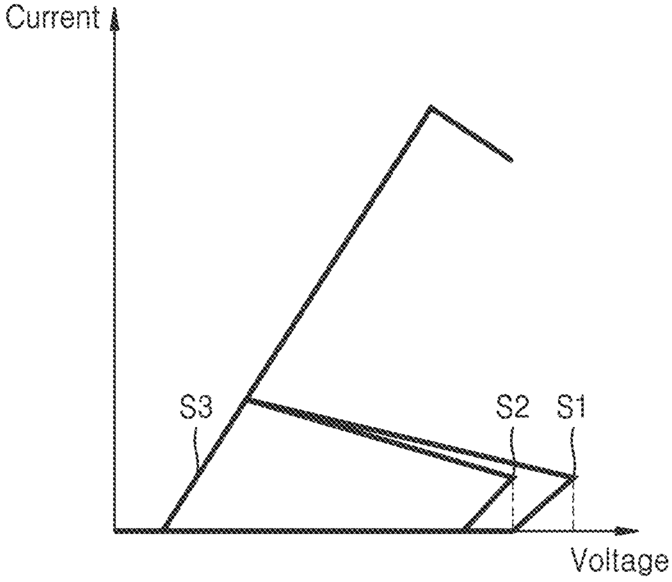
FIG. 20 is a graph showing characteristics of a device according to an embodiment.

FIG. 19 is a circuit diagram showing an equivalent circuit 190 of a device according to an embodiment, and FIG. 20 is a graph showing characteristics of the device according to an embodiment. Compared to the equivalent circuit 50 of FIG. 5, the equivalent circuit 190 of FIG. 19 may include a capacitor C and a resistor R connected to the gate of NFET Mn. It is noted that a capacitor C and a resistor R may be added to other embodiments as well as in the equivalent circuit 190 of FIG. 19. For example, when a capacitor and a resistor are connected to the gate of the PFET as a trigger transistor, one end of the capacitor may be connected to the second node N2 and one end of the resistor may be connected to the first node N1. Hereinafter, in the description of FIG. 19, descriptions previously given with reference to the drawings are omitted.

The equivalent circuit 190 may include first and second silicon-controlled rectifiers SCR1 and SCR2, an NFET Mn, and first and second segment resistors $R_{SEG1}$ and $R_{SEG2}$. The first silicon-controlled rectifier SCR1 may include a first PNP BJT Qp1, a first NPN BJT Qn1, and a first p-well resistor Rp1, and the second silicon-controlled rectifier SCR2 may include a second PNP BJTs Qp2, a second NPN BJT Qn2, and a second p-well resistor Rp2. When an electrostatic discharge occurs between the first node N1 and the second node N2, a gate voltage of the NFET Mn may increase early due to the capacitor C and the resistor R, and the trigger current generated by NFET Mn may drive the first and second silicon-controlled rectifiers SCR1 and SCR2 early.

In order to adjust the trigger voltage, a capacitance of the capacitor C and a resistance value of the resistor R may be adjusted. For example, the trigger voltage may depend on a time constant according to the capacitance of the capacitor C and the resistance value of the resistor R. Accordingly, as shown in FIG. 20, as the time constant increases, the trigger voltage may sequentially decrease as shown in first to third snapback curves S1 to S3.

Figure 21:
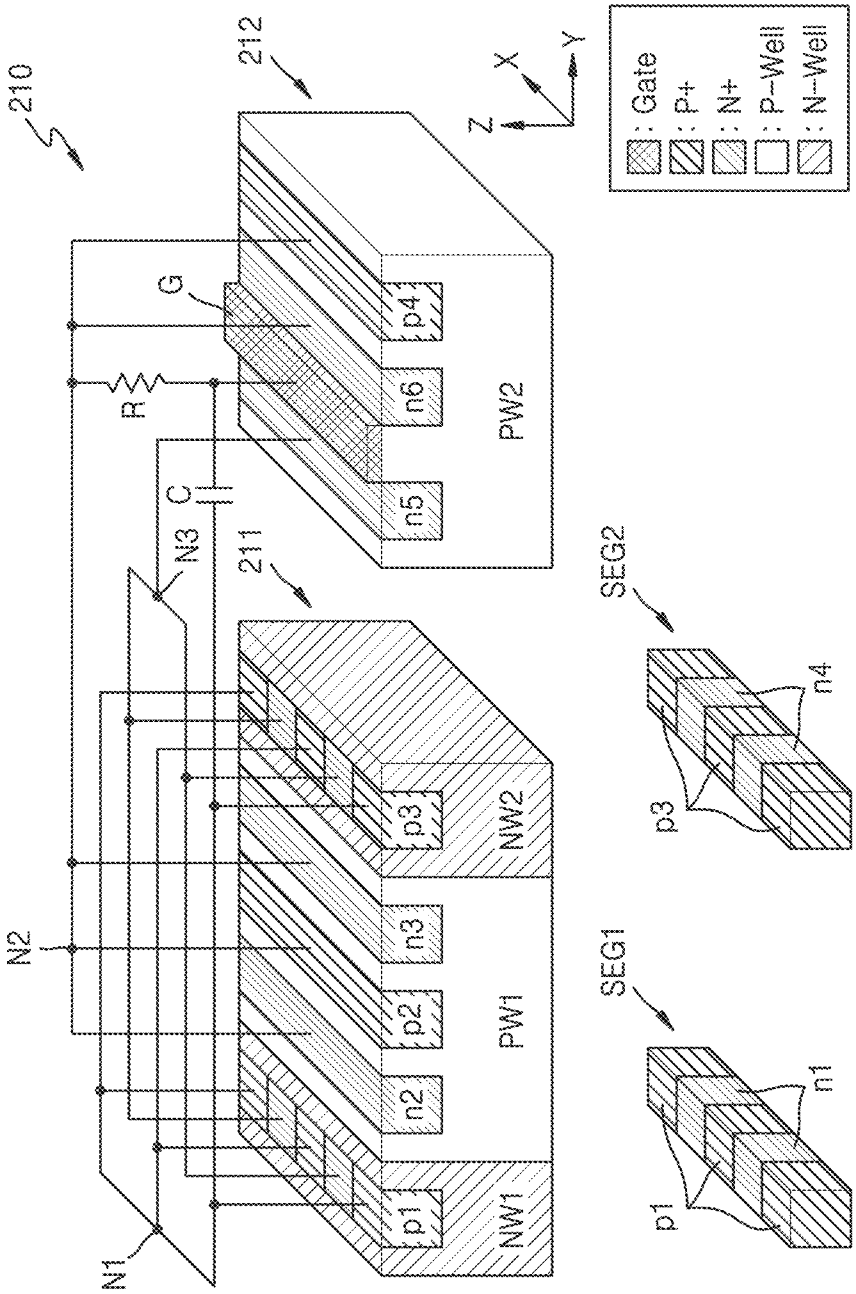
FIG. 21 is a diagram showing a layout of a device according to an embodiment.

FIG. 21 is a diagram illustrating a layout 210 of a device according to an embodiment. For example, FIG. 21 shows the layout 210 corresponding to the equivalent circuit 190 of FIG. 19. For convenience of illustration, contacts and conductive patterns for interconnecting the p+ regions, n+ regions, and gates are omitted. In FIG. 21, p+ regions and n+ regions respectively disposed in a first n-well NW1 and a second n-well NW2 are additionally shown at a bottom as a first segment SEG1 and a second segment SEG2. In some embodiments, the structure of FIG. 21 may be formed in a p-type substrate, and the first p-well PW1 and the second p-well PW2 may correspond to the p-type substrate. Hereinafter, in the description of FIG. 21, descriptions previously given with reference to the drawings are omitted.

In FIG. 21, a layout 210 may include an SCR structure 211 and a FET structure 212. The SCR structure 211 may include first and second n-wells NW1 and NW2 and a first p-well PW1 extending in the X-axis direction. As shown in FIG. 21, the first n-well NW1 and the second n-well NW2 may be adjacent to the first p-well PW1 in the Y-axis direction. The first segment SEG1 may be disposed in the first n-well NW1, and the first segment SEG1 may include first p+ regions p1 and first n+ regions n1. As shown in FIG. 21, the first p+ regions p1 may be spaced apart from each other in the X-axis direction, and the first n+ regions n1 may be disposed between the first p+ regions p1. The first p+ regions p1 may be electrically connected to a first node N1, and the first n+ regions n1 may be electrically connected to a third node N3. A second n+ region n2, a second p+ region p2, and a third n+ region n3 may be disposed in the first p-well PW1. The second n+ region n2, the second p+ region p2, and the third n+ region n3 may be electrically connected to a second node N2. The second segment SEG2 may be disposed in the second n-well NW2, and the second segment SEG2 may include third p+ regions p3 and fourth n+ regions n4. As shown in FIG. 21, the third p+ regions p3 may be spaced apart from each other in the X-axis direction, and the fourth n+ regions n4 may be disposed between the third p+ regions p3. The third p+ regions p3 may be electrically connected to the first node N1, and the fourth n+ regions n4 may be electrically connected to the third node N3.

The FET structure 212 may include a second p-well PW2 extending in the X-axis direction. A fifth n+ region n5, a sixth n+ region n6, and a fourth p+ region p4 may be disposed in the second p-well PW2, and a gate electrode G may be disposed on a region between the fifth n+ region n5 and the sixth n+ region n6. The fifth n+ region n5 may be electrically connected to the third node N3. The gate electrode G may be electrically connected to the second node N2 through the resistor R, and the capacitor C may be electrically connected between the first node N1 and the gate electrode G. The sixth n+ region n6 and the fourth p+ region p4 may be electrically connected to the second node N2. The fifth n+ region n5, the sixth n+ region n6 and the gate electrode G may correspond to the NFET (Mn) of FIG. 17, and thus the NFET Mn may be connected to two silicon-controlled rectifiers, that is, first and second silicon-controlled rectifiers SCR1 and SCR2 of FIG. 17, respectively, through the first n+ regions n1 and the fourth n+ regions n4 connected to the third node N3. Also, due to the resistor R and the capacitor C, a gate voltage of the NFET Mn may increase early.

The first PNP BJT Qp1 of FIG. 19 may include an emitter corresponding to the first p+ regions p1, a base corresponding to the first n-well NW1, and a collector corresponding to the first p-well PW1. The first NPN BJT Qn1 may include a collector corresponding to the first n-well NW1, a base corresponding to the first p-well PW1, and an emitter corresponding to the second n+ region n2. The second PNP BJT Qp2 may include an emitter corresponding to the second p+ regions p2, a base corresponding to the second n-well NW2, and a collector corresponding to the first p-well PW1. The second NPN BJT Qn2 may include a collector corresponding to the second n-well NW2, a base corresponding to the first p-well PW1, and an emitter corresponding to the third n+ region n3. The first segment resistor $R_{SEG1}$ may correspond to a resistor between the first n-well NW1 and the first n+ regions n1, and the second segment resistor $R_{SEG2}$ may correspond to a resistor between the second n-well NW2 and the fourth n+ regions n4. Also, the first p-well resistor Rp1 and the second p-well resistor Rp2 may respectively correspond to resistors between the first p-well PW1 and the second p+ region p2. The NFET Mn may include a drain corresponding to the fifth n+ region n5, a gate corresponding to the gate electrode G, and a source corresponding to the sixth n+ region n6.

Figure 22:
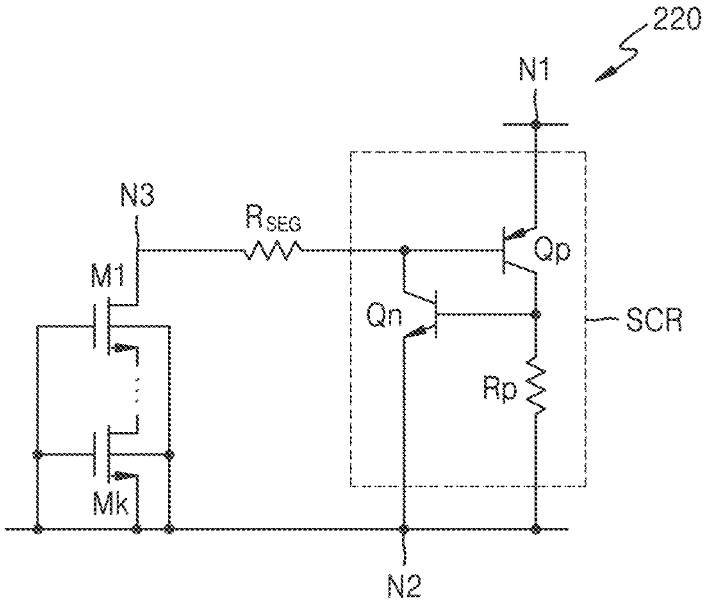
FIG. 22 is a circuit diagram of a device according to an embodiment.
Figure 23:
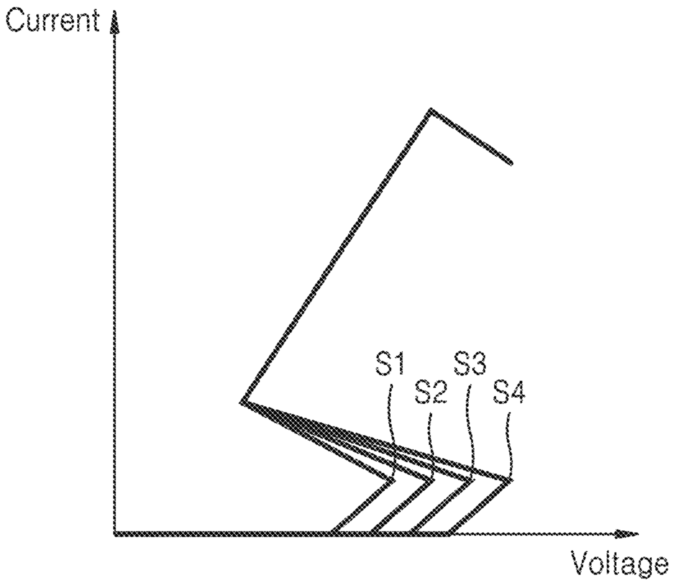
FIG. 23 is a graph showing characteristics of a device according to an embodiment.

FIG. 22 is a circuit diagram illustrating a device 220 according to an embodiment, and FIG. 23 is a graph showing characteristics of the device 220 according to an embodiment. The device 220 may include a segment resistor $R_{SEG}$ with alternately disposed p+ regions and n+ regions, as described above with reference to FIG. 4 and others. In the description of FIGS. 22 and 23, descriptions previously given with reference to the drawings are omitted.

In FIG. 22, the device 220 may include a silicon-controlled rectifier SCR, first to $k^{th}$ NFETs M1 through Mk, and a segment resistor $R_{SEG}$, where k is an integer greater than 1. The silicon-controlled rectifier SCR may include a PNP BJT Qp, an NPN BJT Qn, and a p-well resistor Rp. The first to $k^{th}$ NFETs M1 to Mk may be connected in series between a second node N2 and a third node N3 and may respectively have gates and bodies connected to the second node N2.

A trigger voltage of the silicon-controlled rectifier SCR may depend on the number of first to $k^{th}$ NFETs M1 to Mk. For example, as shown in FIG. 23, as the number of NFETs connected in series increases, as in the first to fourth snapback curves S1 to S4, a voltage at which a trigger current is generated, that is, the trigger voltage, may gradually increase. It is noted that, in the embodiments described above with reference to the drawings, it is also possible to use two or more PFETs connected in series to adjust the trigger voltage.

Figure 24:
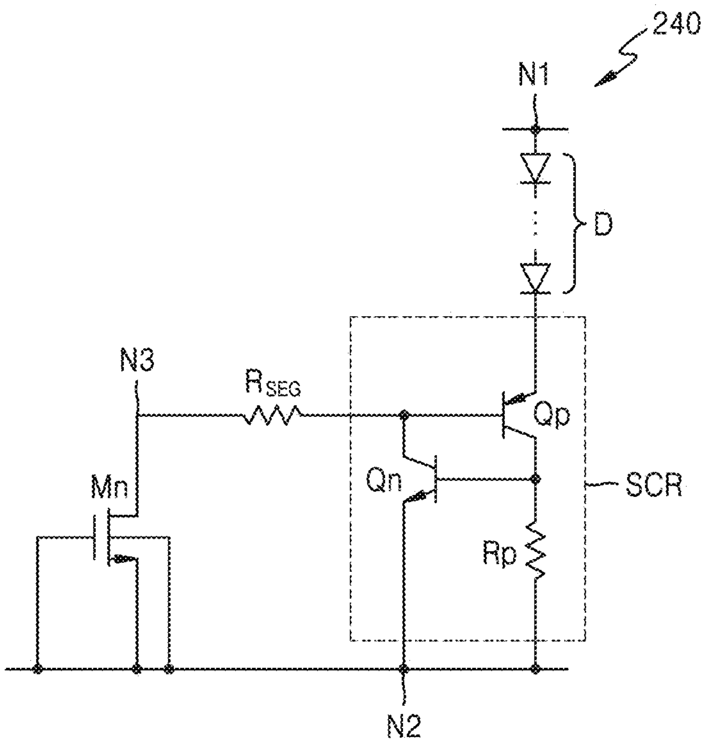
FIG. 24 is a circuit diagram of a device according to an embodiment.
Figure 25:
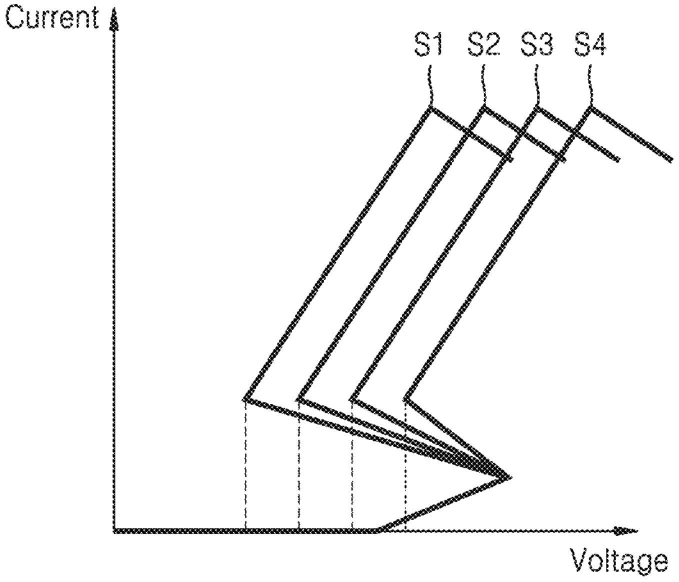
FIG. 25 is a graph showing characteristics of a device according to an embodiment.

FIG. 24 is a circuit diagram illustrating a device 240 according to an embodiment, and FIG. 25 is a graph showing characteristics of the device 240 according to an embodiment. The device 240 may include a segment resistor $R_{SEG}$ with alternately disposed p+ regions and n+ regions, as described above with reference to FIG. 4 and others. In the description of FIGS. 24 and 25, descriptions previously given with reference to the drawings are omitted.

In FIG. 24, the device 240 may include a silicon-controlled rectifier SCR, an NFET Mn, at least one diode D, and a segment resistor $R_{SEG}$. The silicon-controlled rectifier SCR may include a PNP BJT Qp, an NPN BJT Qn, and a p-well resistor Rp. At least one diode D may be connected in a forward direction between a first node N1 and the silicon-controlled rectifier SCR.

A hold voltage of the silicon-controlled rectifier SCR may depend on the at least one diode D. For example, the hold voltage may correspond to the sum of a base-collector voltage of the NPN BJT Qn, an emitter-collector voltage of the PNP BJT Qp, and a forward voltage of the at least one diode D. Accordingly, as shown in FIG. 25, as the number of at least one diode D increases, the hold voltage may gradually increase as shown in the first to fourth snapback curves S1 to S4. It is noted that in the embodiments described above with reference to the figures, at least one diode D may be inserted to adjust the hold voltage.

Figure 26:
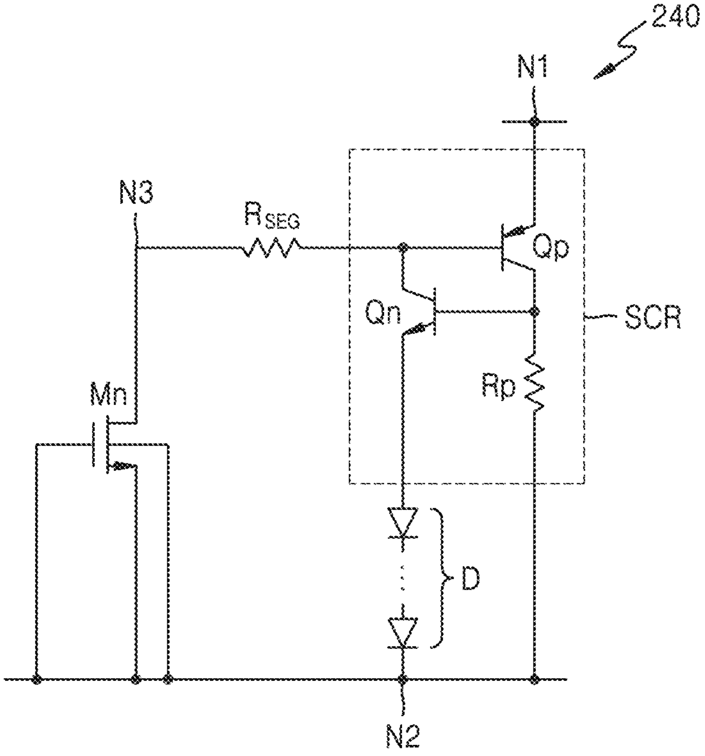
FIG. 26 is a circuit diagram of a device according to an embodiment.
Figure 27:
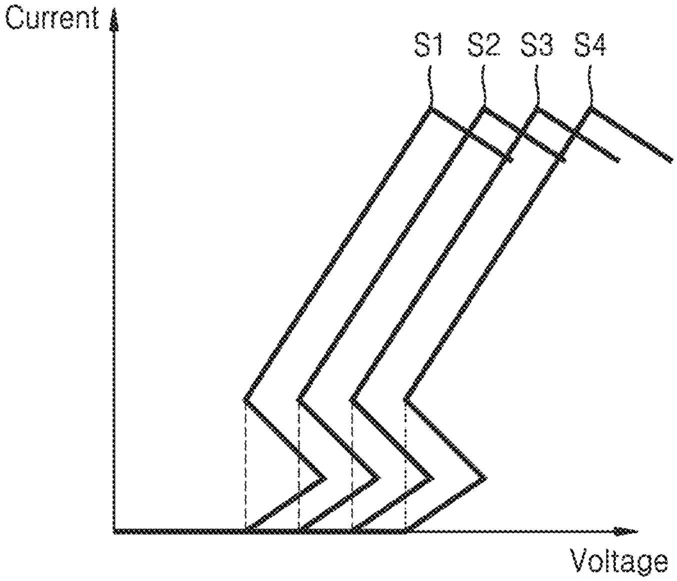
FIG. 27 is a graph showing characteristics of a device according to an embodiment.

FIG. 26 is a circuit diagram illustrating a device 260 according to an embodiment., and FIG. 27 is a graph showing characteristics of the device 260 according to an embodiment. The device 260 may include a segment resistor $R_{SEG}$ with alternately disposed p+ regions and n+ regions, as described above with reference to FIG. 4 and others. In the description of FIGS. 26 and 27, descriptions previously given with reference to the drawings are omitted.

In FIG. 26, the device 260 may include a silicon-controlled rectifier SCR, an NFET Mn, at least one diode D, and a segment resistor $R_{SEG}$. The silicon-controlled rectifier SCR may include a PNP BJT Qp, an NPN BJT Qn, and a p-well resistor Rp. The at least one diode D may be connected in a forward direction between the silicon-controlled rectifier SCR and the second node N2.

A trigger voltage and hold voltage of the silicon-controlled rectifier SCR may depend on the at least one diode D. For example, the trigger voltage and hold voltage may depend on the forward voltage of the at least one diode D. Accordingly, as shown in FIG. 27, as the number of the at least one diode D increases, the trigger voltage and the hold voltage may gradually increase as shown in first to fourth snapback curves S1 to S4. It is noted that, in the embodiments described above with reference to the drawings, at least one diode D may be inserted to adjust the trigger voltage and the hold voltage.

While the disclosure has been particularly shown and described with reference to embodiments thereof, it will be understood that various changes in form and details may be made therein without departing from the spirit and scope of the following claims.

What is claimed is:

1. A device comprising:

a first silicon-controlled rectifier comprising a first PNP bipolar junction transistor (BJT) and a first NPN BJT in which bases and collectors are cross-coupled; and a field effect transistor (FET) configured to, based on an electrostatic discharge occurring between an anode of the first silicon-controlled rectifier and a cathode of the first silicon-controlled rectifier, trigger the first silicon-controlled rectifier, wherein an emitter of the first PNP BJT corresponds to a plurality of first p+ regions being spaced apart from each other in a first direction, wherein the FET is connected to the first silicon-controlled rectifier through at least one first n+ region disposed between the plurality of first p+ regions, wherein a base of the first PNP BJT corresponds to a first n-well in which the plurality of first p+ regions and the at least one first n+ region are disposed, the first n-well extending in the first direction, and wherein a collector of the first PNP BJT corresponds to a p-well adjacent to the first n-well in a second direction crossing the first direction and the p-well extending in the first direction.

2. The device of claim 1, wherein a collector of the first NPN BJT corresponds to the first n-well, wherein a base of the first NPN BJT corresponds to the p-well, and wherein an emitter of the first NPN BJT corresponds to an n+ region in the p-well.

3. The device of claim 1, wherein the collector of the first PNP BJT and the base of the first NPN BJT are connected to the cathode through a p+ region disposed in the p-well.

4. The device of claim 1, further comprising a second silicon-controlled rectifier comprising a second PNP BJT and a second NPN BJT in which bases and collectors are cross-coupled, wherein the second silicon-controlled rectifier is connected in parallel with the first silicon-controlled rectifier, wherein an emitter of the second PNP BJT corresponds to a plurality of second p+ regions spaced apart from each other in the first direction, and wherein the FET is connected to the second silicon-controlled rectifier through at least one second n+ region disposed between the plurality of second p+ regions.

5. The device of claim 4, wherein a base of the second PNP BJT corresponds to a second n-well in which the plurality of second p+ regions and the at least one second n+ region are disposed, the second n-well being adjacent to the p-well in the second direction, and the second n-well extending in the first direction, and wherein a collector of the second PNP BJT corresponds to the p-well.

6. The device of claim 5, wherein a collector of the second NPN BJT corresponds to the second n-well, wherein the base of the second NPN BJT corresponds to the p-well, and wherein an emitter of the second NPN BJT corresponds to an n+ region in the p-well.

7. The device of claim 1, wherein a first sum of lengths of the plurality of first p+ regions in the first direction is greater than a second sum of at least one length of the at least one first n+ region in the first direction.

8. The device of claim 1, wherein a first sum of lengths of the plurality of first p+ regions in the first direction is less than a second sum of at least one length of the at least one first n+ region in the first direction.

9. The device of claim 1, further comprising a resistor connected between the at least one first n+ region and the FET.

10. The device of claim 1, wherein the FET is an n-channel field effect transistor (NFET), wherein the NFET comprises:

a gate electrically connected to the cathode;

a source electrically connected to the cathode; and a drain electrically connected to the at least one first n+ region.

11. The device of claim 10, further comprising:

a capacitor connected between the anode and the gate; and a resistor connected between the gate and the cathode.

12. The device of claim 1, wherein the FET is a p-channel field effect transistor (PFET), wherein the PFET comprises:

a gate electrically connected to the anode;

a drain electrically connected to the cathode; and a source connected to the at least one first n+ region.

13. The device of claim 12, further comprising:

a resistor connected between the anode and the gate; and a capacitor connected between the gate and the cathode.

14. The device of claim 1, wherein each of the plurality of first p+ regions and the at least one first n+ region is disposed between two adjacent gate electrodes extending in the second direction.

15. A device comprising:

a first silicon-controlled rectifier comprising a first PNP bipolar junction transistor (BJT) and a first NPN BJT in which bases and collectors are cross-coupled; and a field effect transistor (FET) configured to, based on an electrostatic discharge occurring between an anode and a cathode of the first silicon-controlled rectifier, trigger the first silicon-controlled rectifier, wherein an emitter of the first NPN BJT corresponds to a plurality of n+ regions spaced apart from each other in a first direction, wherein the FET is connected to the first silicon-controlled rectifier through at least one p+ region disposed between the plurality of n+ regions, wherein a base of the first NPN BJT corresponds to a p-well in which the plurality of n+ regions and the at least one p+ region are disposed, the p-well extending in the first direction, and wherein a collector of the first NPN BJT corresponds to a first n-well adjacent to the p-well in a second direction crossing the first direction and the first n-well extending in the first direction.

16. The device of claim 15, wherein a collector of the first PNP BJT corresponds to the p-well, wherein the base of the first PNP BJT corresponds to the first n-well, and wherein an emitter of the first PNP BJT corresponds to a p+ region in the first n-well.

17. A device comprising:

a p-well extending in a first direction;

a first n-well adjacent to the p-well in a second direction crossing the first direction, the first n-well extending in the first direction;

a first n+ region electrically connected to a cathode node and disposed in the p-well;

a first p+ region electrically connected to the cathode node and disposed in the p-well;

a plurality of second p+ regions electrically connected to an anode node, the plurality of second p+ regions being spaced apart from each other in the first direction in the first n-well; and at least one second n+ region electrically connected to a field effect transistor (FET) that is electrically connected to the cathode node or the anode node, the at least one second n+ region being disposed between the plurality of second p+ regions in the first n-well.

18. The device of claim 17, further comprising:

a second n-well adjacent to the p-well in the second direction, the second n-well extending in the first direction;

a third n+ region electrically connected to the cathode node, the third n+ region being disposed in the p-well;

a plurality of third p+ regions electrically connected to the anode node, the plurality of third p+ regions being spaced apart from each other in the first direction in the second n-well; and at least one fourth n+ region electrically connected to the FET, the at least one fourth n+ region being disposed between the plurality of third p+ regions in the second n-well.

* * * * *